(12) United States Patent
Murooka et al.

(10) Patent No.: US 6,467,884 B1
(45) Date of Patent: Oct. 22, 2002

(54) SUBSTRATE UNIT FOR LIQUID DISCHARGING HEAD, METHOD FOR PRODUCING THE SAME, LIQUID DISCHARGING HEAD, CARTRIDGE, AND IMAGE FORMING APPARATUS

(75) Inventors: Fumio Murooka, Atsugi; Kei Fujita, Kawasaki; Yukihiro Hayakawa; Makoto Terui, both of Yokohama, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 71 days.

(21) Appl. No.: 09/643,931

(22) Filed: Aug. 23, 2000

(30) Foreign Application Priority Data

Aug. 24, 1999 (JP) ............................................. 11-236291
Aug. 21, 2000 (JP) ....................................... 2000-250081

(51) Int. Cl.[7] ................................................... B41J 2/05
(52) U.S. Cl. ...................................................... 347/64
(58) Field of Search ........................... 347/64, 102, 104, 347/47, 101, 65, 100, 105, 13, 17, 56, 43, 67, 180, 96, 61, 62, 94, 20; 29/890.1

(56) References Cited

U.S. PATENT DOCUMENTS

| 4,165,058 A | 8/1979 | Whitener |
| 5,485,158 A | 1/1996 | Sueoka et al. |
| 5,870,121 A | 2/1999 | Chan |

FOREIGN PATENT DOCUMENTS

| DE | 42 23 707 | 1/1993 |
| JP | 52-118798 | 10/1977 |
| JP | 54-59936 | 5/1979 |
| JP | 60-234850 | 11/1985 |
| JP | 62-45237 | 2/1987 |
| JP | 62-45283 | 2/1987 |
| JP | 62-45286 | 2/1987 |
| JP | 11-348290 | 12/1999 |

*Primary Examiner*—Raquel Yvette Gordon
(74) *Attorney, Agent, or Firm*—Fitzpatrick, Cella, Harper & Scinto

(57) ABSTRACT

To provide a substrate unit for liquid discharging head, a method for producing the same, a liquid discharging head, a cartridge, and an image forming apparatus. The substrate unit for liquid discharging head is for a head which gives thermal energy to the liquid for film boiling, to discharge droplets of the liquid from its discharge port. The substrate unit includes an electrothermal transducer provided on the substrate surface to generate thermal energy, a pair of electrode wiring circuits provided on the substrate surface and connected to the transducer, first protective layer formed over the substantially entire surface of the substrate to cover a pair of the electrode wiring circuits and transducer, and second protective layer formed over the first protective layer to cover the transducer and the area where the transducer is connected to the wiring circuit, in which a pair of the electrode wiring circuits are 1800 to 2400 Å thick, and the portion of the first protective layer covered by the second protective layer is 2600 to 3400 Å thick and thicker than the portion of the first protective layer not covered by the second protective layer.

25 Claims, 19 Drawing Sheets

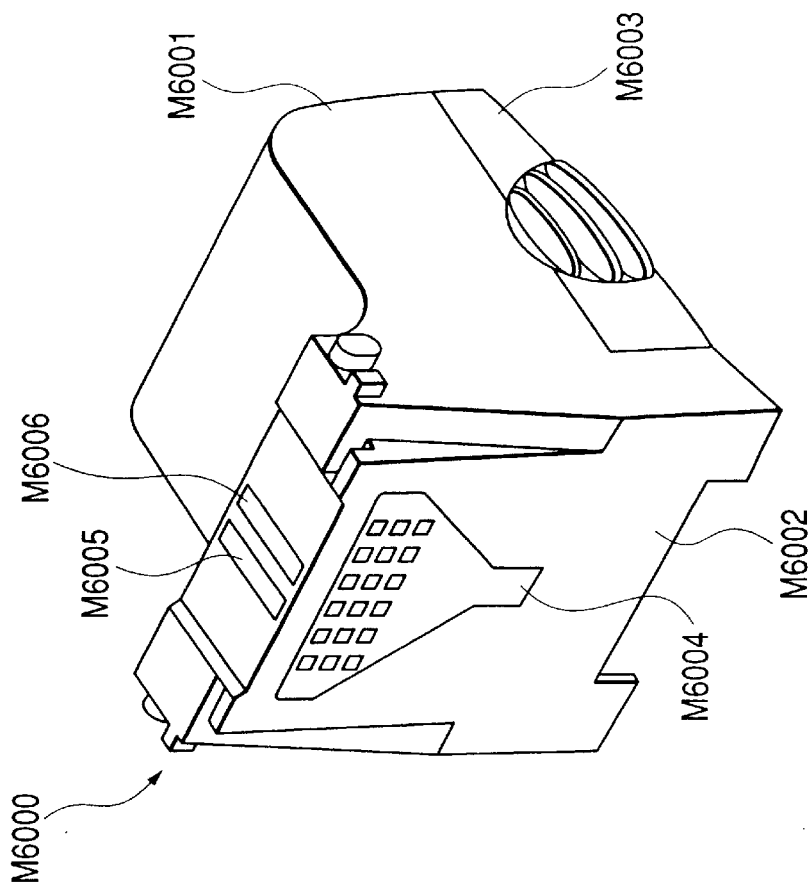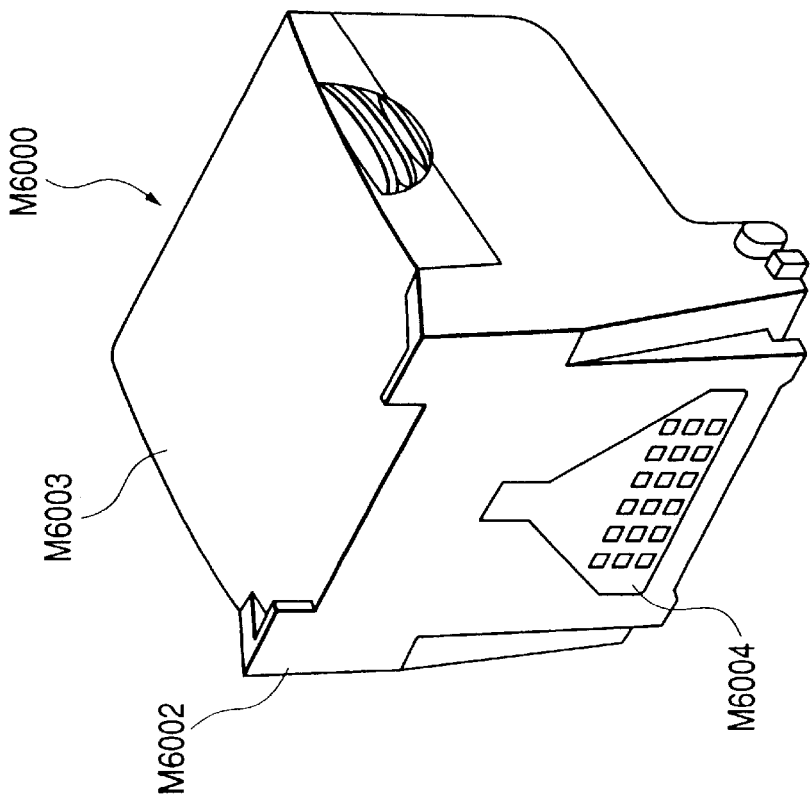

| FIG. 9A | FIG. 9B | FIG. 9C |

SUBSTRATE UNIT FOR LIQUID DISCHARGING HEAD, METHOD FOR PRODUCING THE SAME, LIQUID DISCHARGING HEAD, CARTRIDGE, AND IMAGE FORMING APPARATUS

BACKGROUND OF THE INVENTION

Field of the Invention

This invention relates to a substrate unit for a liquid discharging head which discharges liquid, method for producing the same, liquid discharging head incorporating the substrate unit, cartridge which monolithically combines the liquid discharging head and liquid tank holding a liquid to be sent to the liquid discharging head, and image forming apparatus which forms an image on a printing medium. They are applicable to general printing apparatuses, copiers, facsimiles having a communication system, word processors or the like having a printing section, industrial recording apparatuses combined with one or more varying processing units, and various devices, such as those for textile printing and etching.

"Printing" or "recording" used in this specification includes forming information of meaning, e.g., letters or patterns, and also forming a variety of images, patterns or the like on a printing medium, whether or not they have a meaning or recognizable by visual sense of a human. It also includes etching and other processing methods.

The "printing medium" used in this specification is not limited to paper or the like to be printed by general printers, but includes fabrics, plastic films, metallic plates, glass sheets, ceramics, lumbers, leathers or the like which can receive an ink. Its shape is not limited, but includes three-dimensional objects, e.g., spheres and cylinders, in addition to sheet-shaped objects.

The "liquid" used in this specification should be interpreted broadly, as is the case of definition of the above-described "printing or recording," and includes those for forming images, patterns or the like on a printing medium, etching of a printing medium, and processing of ink, e.g., solidification or insolubilization of a colorant in a ink attached to a printing medium.

RELATED BACKGROUND ART

Of the various printing methods known so far, liquid jet printing method (hereinafter referred to as ink jet printing method) is a very useful method for various reasons, e.g., nonimpact type printing which produces little noise while being in service, highspeed printing, and capacity of printing a common paper without needing a special fixation treatment.

This ink jet printing method flies droplets of an ink or a treatment solution for adjusting printability of an ink on a printing medium (hereinafter referred to generically as ink) by a varying working principle onto a printing medium, e.g., paper, for printing. The basic principle, as described by Japanese Patent Application Laid-Open No. 54-59936, is outlined below. In the ink jet printing method, thermal pulses are given as the information signal to an ink in an ink chamber capable of holding an ink, thereby discharging and flying the ink in the form of droplets by the force generated as a result of vaporization/expansion of the ink through a discharge port connected to the ink chamber onto a printing medium for printing.

This method has various advantages. It is suitable for high-speed prints and color prints, when a high-density, multi-array structure is used. The printer structure therefor can be simpler than the conventional one, making the printing head, i.e., ink jet head, compacter as a whole. Such heads are suitable for mass production, and may be elongated by fully utilizing IC and microwave processing techniques, which have been greatly advanced in level and reliability for the semiconductor industry. As such, it is applicable to wide areas.

A characteristic ink jet head of the ink jet printer for the ink jet printing method is provided with thermal energy generating means for forming flying droplets of ink discharged from the discharge port. It is considered that the thermal energy generating means is preferably designed to come into direct contact with the ink, for efficiently acting the energy on the ink and enhancing response of the ink jet head to the ON-OFF thermal actions.

The thermal energy generating means for an ink jet head is basically comprises a heat generating resist (electrothermal transducer) layer and a pair of electrode circuits for supplying electricity to the layer. Such a design may cause various problems, when the resist layer directly comes into contact with the ink, e.g., the ink may pass electricity, depending on its electrical resistance, to possibly cause electrolysis of the ink itself, or the energized resist layer may react with the ink on supplying electricity to the heat generating resist layer, to possibly cause corrosion of the resist layer to change its resist and eventual failure or breakdowns.

Therefore, various methods have been proposed to solve the above problems and thereby to improve reliability and durability of the resist layer for repeated used. For example, the resist layer is made of an inorganic material of relatively good characteristics for heat generating resist layer, e.g., alloy such as Ni or Cr, or metal boride such as $ZrB_2$ or $HfB_2$. The resist layer may be coated with a protective layer of an oxidation-resistant compound, e.g., $SiO_2$, to positively prevent it from directly coming into contact with the ink.

It is a normal practice, when thermal energy generating means for an ink jet head is produced, to coat a heat generating resist layer, formed on a given substrate, with electrode circuits and a protective layer in this order. The protective layer is required to uniformly cover the resist layer to fully satisfy the requirements, i.e., prevention of failure of the resist layer and short-circuit between the resist layer and electrode wiring. In addition, it should be free of defects, e.g., pinholes.

Normally, the protective layer is further coated with a second, relatively thin protective layer, in order to securely cut off the protective layer from the ink. The thin second layer is normally of a metal, e.g., Ta, formed by sputtering. This second protective layer prevents inflow of ink, even when the first protective layer of $SiO_2$, SiN or the like is cracked by repeated exposure to heat, generated in the heat generating resist layer. It also protects the resist layer from cavitation, resulting from foaming and defoaming cycles, to improve durability of the layer for repeated use.

However, the second protective layer may cause cracking of the first protective layer below, because of stresses therein being different from each other. Therefore, the second protective layer is normally removed by etching in the region free of the ink on the substrate surface.

When a resin is used for forming the discharge port, it is little adhesive to the second protective layer of Ta or the like, causing the discharge port to easily come off the second protective layer. One of the proposals to solve the above problem is use of an adhesive layer of polyether amide or the like between the substrate coated with the second protective layer of Ta or the like and material that forms the discharge port, in order to improve adhesion between them, as disclosed by Japanese Patent Application Laid-Open No. 11-348290.

The ink jet head generally comprises an electric wiring on the heat generating resist layer, as described earlier, and one or more steps tend to be formed between the electric wiring and the heat generating resist layer. Thickness of the layer tends to be uneven around such a step, and the layer must be formed in such a way to sufficiently cover the step and prevent exposure of the wiring or resist layer it protects. When coverage of the step (hereinafter referred to as "step coverage") is insufficient, the exposed portion of the heat generating resist layer may directly come into contact with the ink, to possibly cause problems, e.g., electrolysis of the ink, and reactions between the ink and a material which constitutes the heat generating resist layer to eventually destroy the resist layer. Such a step tends to cause uneven layer thickness, which, in turn, may cause partial concentration of thermal stresses produced in the protective layer as it is repeatedly exposed to heat, and eventually cracking of the protective layer. These cracks or pinholes, if formed, may allow inflow of the ink, to eventually destroy the resist layer.

Conventionally, attempts have been made to solve these problems by increasing thickness of the protective layer to improve step coverage and reduce pinholes. Increasing the thickness does contribute to step coverage and reduced pinholes, but causes new problems, described below, resulting from retarded supply of heat to the ink.

The heat generated in the heat generating resist layer is transferred to the ink via the protective layer. Increased thickness of the protective layer increases thermal resist of the working plane of heat, i.e., the space between the protective layer surface and heat generating resist layer. As a result, the resist layer needs an excessive power load, which is disadvantageous from power saving. In addition, accumulation of excessive heat in the substrate deteriorates its thermal response, and consumption of excessive power deteriorates durability of the heat generating resist layer.

These problems are mitigated as thickness of the protective layer decreases. However, when the protective layer is formed by sputtering or evaporation, which is a normal film-making procedure for producing the conventional ink jet head, decreasing the thickness is substantially limited by the problems associated with insufficient step coverage which deteriorates durability of the resist layer, as described above.

It is known that an ink used for printing by an ink jet head as described above will have improved foaming stability as it is heated at a higher rate. More concretely, electrical signals to be applied to thermal energy generating means are normally rectangular delayed pulses, and decreasing the pulse width improves the foaming stability, thereby improving discharge stability of the flying ink droplets and hence print quality. However, the conventional ink jet must have the protective layer of certain thickness as described above, and excessive heat must be generated by the thermal energy generating means to overcome increased thermal resist of the protective layer, resulting in deteriorated durability and thermal response. This naturally imposes limitations on decreasing pulse width and improving print quality.

Referring to FIG. 17, which shows the sectional structure of the conventional ink jet head on the substrate side, the oxide layer 12 formed on the surface portion of the substrate 11 is coated with the heat generating resist layer 13 by sputtering, on which at least one pair of the electrode wiring circuits 14a and 14b are formed, where the step 15, standing on the heat generating resist layer 13, is formed by the presence of the circuit 14a or 14b.

In such a configuration, defects, e.g., pinholes, tend to be formed in the lower, first protective layer 17 coated with the second protective layer 16, in particular around the step 15, where the circuit 14a or 14b tends to be exposed. In order to avoid the above problem, thickness of the first protective layer 17 is increased to an excessive extent (normally at least twice as much as that of the circuit 14a or 14b) to secure sufficient coverage for the step 15.

Some proposals to decrease thickness of the first protective layer 17 without deteriorating step coverage include use of bias sputtering, known for its good step coverage, as the film-making procedure to form the first protective layer 17, as disclosed by Japanese Patent Application Laid-Open No. 60-234850. Japanese Patent Application Laid-Open Nos. 62-45283 and 62-45237 propose the methods to improve step coverage by changing step shapes after the first protective layer 17 is formed using etchback or sputter etch. Japanese Patent Application Laid-Open No. 62-45286 proposes reflow of the protective layer to improve step coverage.

However, bias sputtering involves disadvantages of insufficient stability of film thickness it gives and generation of dust around the target. Etchback, sputter etch and reflow need increased number of processes and push up cost.

Another method, disclosed in HP Journal, May, 1985, proposes tapered sectional structure of the electrode wiring circuits 14a and 14b, as shown in FIG. 18, thereby improving step coverage of the protection layer 15 showing a section of a substrate structure for a conventional ink jet head. Still another method proposed uses a developer as an alkaline solution for simultaneously etching the circuits 14a and 14b and resist. The members shown in FIGS. 17 and 18 are marked with the same numbers, when they are functionally corresponding to each other.

However, the tapered section of the step 15, produced by these methods, is insufficient in uniformity and reproducibility, tending to change area by area, and these methods are particularly disadvantageous for the large-size substrate 11. In particular, insufficient uniformity of the tapered section of the step 15 will cause the following problems:

Step coverage tends to be insufficient at a sharp angle of the tapered section of the step 15, causing the above-described problems. At a gentle angle of the tapered section, on the other hand, the circuits 14a and 14b have a smaller width and cross sectional area than the other parts at a sharper angle, to have a higher electrical resistance. As a result, the circuit for the ink jet head has a fluctuation of a resistance distribution, and, when used for a printer, may deteriorate print quality or the like.

Still another method proposes a different sectional structure of the conventional ink jet head around the substrate, shown in FIG. 19, which has been already commercialized. The protective layer 15 on the heat generating resist layer 13 is selectively thinned. The members shown in FIGS. 17 and 19 are marked with the same numbers, when they are functionally corresponding to each other.

However, this method needs an increased number of steps, because 2 steps are needed for forming the protective films 15a 15b as the insulator after the electrode wiring circuits 14a and 14b are formed, and the region to be selectively thinned is exposed to light using a photomask resulting in the increased steps. Furthermore, selectively thinning the inside of the heat generating region decreases thermal efficiency at its outer periphery.

SUMMARY OF THE INVENTION

It is an object of the present invention to provide a substrate unit for liquid discharging head with improved stability to foaming, which results from rapid heating of the ink, and durability by decreasing, as far as possible, thickness of the first protective layer on the heat generating resist layer, decreasing thickness of the electrode wiring circuit and its layer for the heat generating resist layer, and removing the second protective layer without damaging the first protective and wiring layers.

It is another object of the present invention to provide a highly reliable liquid discharging head, which incorporates the above substrate unit, with improved adhesion between the substrate with exposed protective layer of Ta or the like and member which forms the discharge port.

It is still another object of the present invention to provide a method for forming the above substrate unit for liquid discharging head, and also to provide a cartridge and image forming apparatus.

The substrate unit for liquid discharging head of the present invention is for a head which gives thermal energy to the liquid for film boiling, to discharge droplets of the liquid from its discharge port. It comprises an electrothermal transducer provided on the substrate surface to generate thermal energy, a pair of electrode wiring circuits provided on the substrate surface and connected to the transducer, first protective layer formed over the substantially entire surface of the substrate to cover a pair of the electrode wiring circuits and transducer, and second protective layer formed over the first protective layer to cover the transducer and the area in which the transducer is connected to the wiring circuit, wherein a pair of the electrode wiring circuits are 1800 to 2400 Å thick, and the portion of the first protective layer covered by the second protective layer is 2600 to 3400 Å thick and thicker than the portion of the first protective layer not covered by the second protective layer.

The present invention has the first protective layer which is made uniformly thin while securing sufficient step coverage on the area where a step is formed by the wiring circuit to stand on the protective layer, without needing an additional film-making step or use of mask.

A pair of the electrode wiring circuits for the substrate unit for liquid discharging head of the present invention are preferably 2000 to 2200 Å thick, and the portion of the first protective layer covered by the second protective layer is preferably thicker than the one not covered by the second protective layer by 100 to 200 Å. The first protective layer is preferably at least 1.08 times thicker than the wiring circuit.

The method of the present invention is for producing the substrate unit for liquid discharging head which gives thermal energy to the liquid for film boiling, to discharge droplets of the liquid from its discharge port. It comprises (a) a step of forming an electrothermal transducer on the substrate surface to generate thermal energy, (b) a step of forming a pair of electrode wiring circuits on the substrate surface in such a way to connect them to the transducer, (c) a step of forming a 2600 to 3400 Å thick, first protective layer over the essentially entire surface of the substrate to cover a pair of the electrode wiring circuits and transducer, and (d) a step of forming, by dry etching, a second protective layer over the first protective layer to cover the transducer and the area in which the transducer is connected to the wiring circuit, in such a way to keep the portion of the first protective layer not covered by the second protective layer thinner than the one covered by the second protective layer, and also to keep thickness of the electrode wiring circuits at 1800 to 2400 Å.

The method of the present invention prevents, while forming the second protective layer by dry etching, damages of the transducer and a pair of the wiring circuits.

In the method of the present invention for producing the substrate unit for liquid discharging head, the second protective layer may be formed by dry etching in such a way to keep thickness of the etched portion of the first protective layer not covered by the second protective layer at 100 to 200 Å.

The liquid discharging head of the present invention comprises a discharge port from which the liquid is discharged, electrothermal transducer on the substrate surface to generate thermal energy for causing film boiling of the liquid, a pair of electrode wiring circuits provided on the substrate surface and connected to the transducer, first protective layer formed over the essentially entire surface of the substrate to cover a pair of the electrode wiring circuits and transducer, and second protective layer formed over the first protective layer to cover the transducer and the area in which the transducer is connected to the wiring circuit, wherein a pair of the electrode wiring circuits are 1800 to 2400 Å thick, and the portion of the first protective layer covered by the second protective layer is 2600 to 3400 Å thick and thicker than the portion of the first protective layer not covered by the second protective layer.

In one embodiment of the substrate unit of the present invention for liquid discharging head, the discharge ports are formed at intervals of 600 dpi in at least two rows running in parallel to each other, wherein each port in one row may be off the corresponding one in the other row by half a pitch. The liquid may be an ink and/or a treatment solution for adjusting printability of the ink on a printing medium. The liquid may be discharged by driving pulses given to the electrothermal transducer from the discharge port at 5 picoliter or less.

The substrate unit of the present invention for liquid discharging head may have an additional member for forming the discharge port, which is joined with portion of the second protective layer and portion of the first protective layer not covered by the second protective layer via an adhesive layer.

In the above design, the above portions of the first and second protective layers are preferably tapered in the vicinity of the boundary between the portion of the first protective layer covered by the second protective layer and the one not covered by the second protective layer. It is also preferable that the first protective layer is tapered at a sharper angle than the second protective layer. The adhesive layer may be of polyether amide resin, which may be thermoplastic. The member for forming the discharge port may be of resin, which may be hardened epoxy resin by cationic polymerization.

In the substrate unit of the present invention for liquid discharging head, the discharge port may be formed to face the electrothermal transducer.

The cartridge of the present invention comprises a liquid discharging head and liquid tank storing the liquid to be supplied to the liquid discharging head, wherein the liquid discharging head comprises a discharge port from which the liquid is discharged, electrothermal transducer on the substrate surface to generate thermal energy for causing film boiling of the liquid, a pair of electrode wiring circuits provided on the substrate surface and connected to the transducer, first protective layer formed over the essentially entire surface of the substrate to cover a pair of the electrode wiring circuits and transducer, and second protective layer formed over the first protective layer to cover the transducer and the area in which the transducer is connected to the wiring circuit, a pair of the electrode wiring circuits being 1800 to 2400 Å thick, and the portion of the first protective layer covered by the second protective layer being 2600 to 3400 Å thick and thicker than the portion of the first protective layer not covered by the second protective layer.

The cartridge of the present invention may incorporate the liquid tank in such a way that it can be releasably attached to the liquid discharging head.

The cartridge of the present invention may have an additional member for forming the discharge port, which is joined with portion of the second protective layer and portion of the first protective layer not covered by the second protective layer via an adhesive layer.

The image forming apparatus of the present invention is provided with a section of attaching a liquid discharging head comprising discharge ports from which the liquid is discharged, an electrothermal transducer on the substrate surface to generate thermal energy for causing film boiling of the liquid, a pair of electrode wiring circuits provided on the substrate surface and connected to the transducer, first protective layer formed over the essentially entire surface of the substrate to cover a pair of the electrode wiring circuits and transducer, and second protective layer formed over the first protective layer to cover the transducer and the area in which the transducer is connected to the wiring circuit, wherein a pair of the electrode wiring circuits is 1800 to 2400 Å thick, and the portion of the first protective layer covered by the second protective layer is 2600 to 3400 Å thick and thicker than the portion of the first protective layer not covered by the second protective layer.

In the image forming apparatus of the present invention, the section of attaching the liquid discharging head may have a carriage which can be scanned in the direction intersecting the direction of travel of the printing medium onto which the liquid is discharged from the discharge port. The liquid discharging head may be releasably attached to the carriage by attaching/detaching means.

The cartridge of the present invention may have an additional member for forming the discharge port, which is joined with portion of the second protective layer and portion of the first protective layer not covered by the second protective layer via adhesive layers.

The present invention can give the uniformly thin first protective layer, without needing an additional film-making step or use of mask, by providing the first protective layer formed over the substantially entire surface of the substrate to cover a pair of the electrode wiring circuits and transducer, and second protective layer formed over the first protective layer to cover the transducer and the area in which the transducer is connected to the wiring circuit, while keeping a pair of the electrode wiring circuits 1800 to 2400 Å thick, and the portion of the first protective layer covered by the second protective layer 2600 to 3400 Å thick and thicker than the portion of the first protective layer not covered by the second protective layer. It also secures sufficient step coverage on the area where a step is formed by the wiring circuit to stand on the substrate.

The present invention therefore allows the liquid to be heated rapidly to improve foaming stability, leading to saved power for the liquid discharging head and controlled heating, which, in turn, prevents accumulation of heat in the substrate, improves its thermal response, and realizes printing works of high quality at higher driving frequency.

In particular, the first protective layer can be uniformly thinner when thickness of a pair of electrode wiring circuits is kept in a range from 2000 to 2200 Å. Such a thin protective layer will have improved durability, because partial concentration of thermal stresses, caused by cyclic generation of heat, is prevented; otherwise, it may be cracked to allow inflow of the liquid which can disconnect the wiring circuit and eventually destroy the heat generating resist layer. The electrothermal transducer and electrode wiring circuit can be kept intact, when the first protective layer is coated by dry etching with the second protective layer to cover the transducer and the area in which the transducer is connected to the wiring circuit, in such a way to keep the portion of the first protective layer not covered by the second protective layer thinner than the one covered by the second protective layer, and also to keep a pair of the electrode wiring circuits 1800 to 2400 Å thick.

Tapering those sections of the first and second protective layers covered by the member for forming the discharge port improves adhesion between the first protective layer and member for forming the discharge port in the vicinity of the second protective layer, efficiently preventing exfoliation of the member.

Therefore the first protective layer exposed to the electrothermal transducer, a pair of the electrode wiring circuits and driving device provided on the substrate, as a result of removal of the second layer, can sufficiently exhibit its functions in the presence of moisture or in a high humidity atmosphere.

A highly functional liquid discharging head of 1200 dpi can be obtained by forming the discharge ports at intervals of 600 dpi in at least two rows running in parallel to each other, in such a way that each port in one row is off the corresponding one in the other row by half a pitch.

A high-quality image of high resolution can be produced, when driving pulses given to the individual electrothermal transducer is adjusted to discharge the liquid at 4 picoliter from the discharge port.

BRIEF DESCRIPTION OF THE DRAWINGS

FIGS. 6A and 6B are oblique views of one embodiment of the scanner cartridge of the present invention;

DESCRIPTION OF THE PREFERRED EMBODIMENTS

The present invention is described more concretely by preferred embodiments as applied to an ink jet printer, referring to FIGS. 1 to 16. It is to be understood that the present invention is not limited by these preferred embodiments, and variations may be made without departing from the spirit and scope of the invention, described in the claims in this specification.

[Body of the apparatus]

Figure 1:
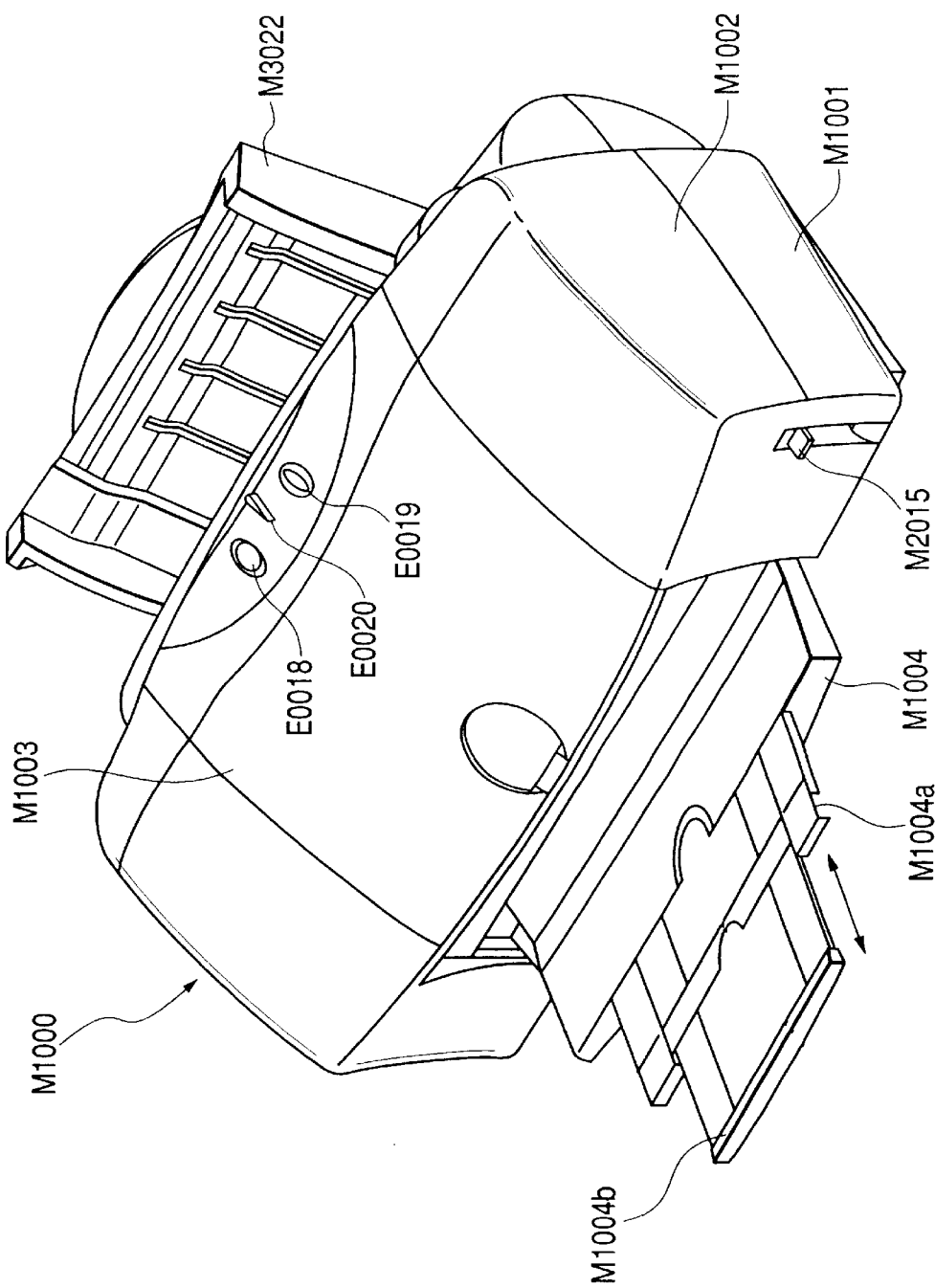
FIG. 1 is an oblique view of one embodiment of the ink jet printer of the present invention.
Figure 2:
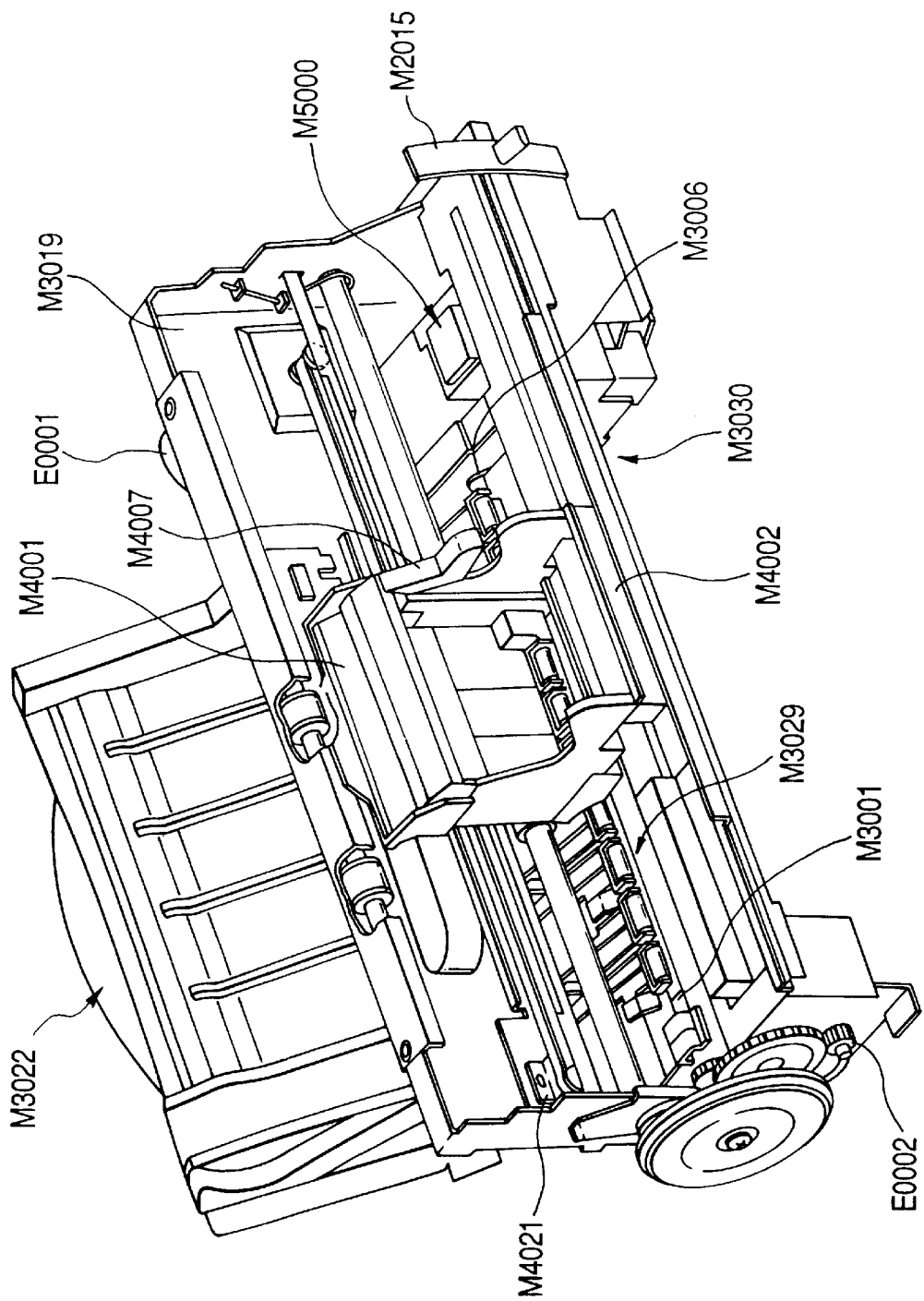
FIG. 2 is an oblique view of the ink jet printer shown in FIG. 1 whose external structures are removed.

FIGS. 1 and 2 outline the structure of the printer working on ink jet recording. Referring to FIG. 1, the body of apparatus M1000, serving as the external structure for the printer of this embodiment, is composed of the lower case M1001, upper case M1002, access cover M1003, and external member for the discharge tray M1004 and chassis M3019 (see FIG. 2) held in the external member.

The chassis M3019 is composed of a plurality of plate-shaped metallic members having a given rigidity, serving as the skeleton for the recorder and also holding the recording mechanisms described later.

The lower case M1001 forms essentially the lower half of the apparatus body M1000, and the upper case M1002 the upper half. They are assembled to form a space therein, which holds various mechanisms described later. They have an opening on the front side and top side, respectively.

The discharge tray M1004 is pivotally supported at one end by the lower case M1001, to rotate to open or close the opening on its front side. The discharge tray M1004 is rotated forward to open the opening while the recorder is in service, to allow the recorded sheets P to be discharged therethrough and accumulated on the tray one by one. The discharge tray M1004 holds two auxiliary trays M1004a and M1004b, which can be drawn forward, as required, to expand the paper-supporting area in 3 stages.

The access cover M1003 is pivotally supported at one end by the upper case M1002, to rotate to open or close the opening on its top side. When the access cover M1003 is opened, the recording head cartridge H1000, ink tank H1900 or the like can be exchanged. When the access cover M1003 is opened or closed, the projection (not shown) on the back side rotates the cover opening/closing lever, the rotational position of the lever being detected by a microswitch or the like to detect the opened or closed condition of the access cover.

An electrical source key E0018 and resume key E0019 are provided on the upper case M1002 at the rear of the upper side in such a way that they can be pushed down. The LED E0020 is also provided, flickering when the electrical source key E0018 is pushed down, to inform the operator that the recorder is ready for service. The LED E0020 has various display functions, to inform printer troubles or the like to the operator by changing the flickering manner or color or activating the buzzer E0021 (see FIG. 7). The printer can be restarted by pushing down the resume key E0019, after the trouble is solved.

[Recording mechanism]

The recording mechanism, held in the printer apparatus body M1000, for one embodiment of the present invention is described.

The recording mechanism of this embodiment comprises the automatic supply section M3022 which automatically supplies the recording sheets P into the apparatus body, transfer section M3029 which passes the recording sheets P, sent one by one out of the automatic supply section, to a given recording position, and guides the transferred recording sheets P toward the discharge section M3030, recording section which records information on the recording sheets P sent to the transfer section M3029, and recovery section M5000 which recovers the recording section or the like.

(Recording section)

The recording section is described.

The recording section is composed of the carriage M4001, movably supported by the carriage axis M4021, and recording head cartridge H1000 releasably supported by the carriage M4001.

Recording head cartridge

Figure 3:
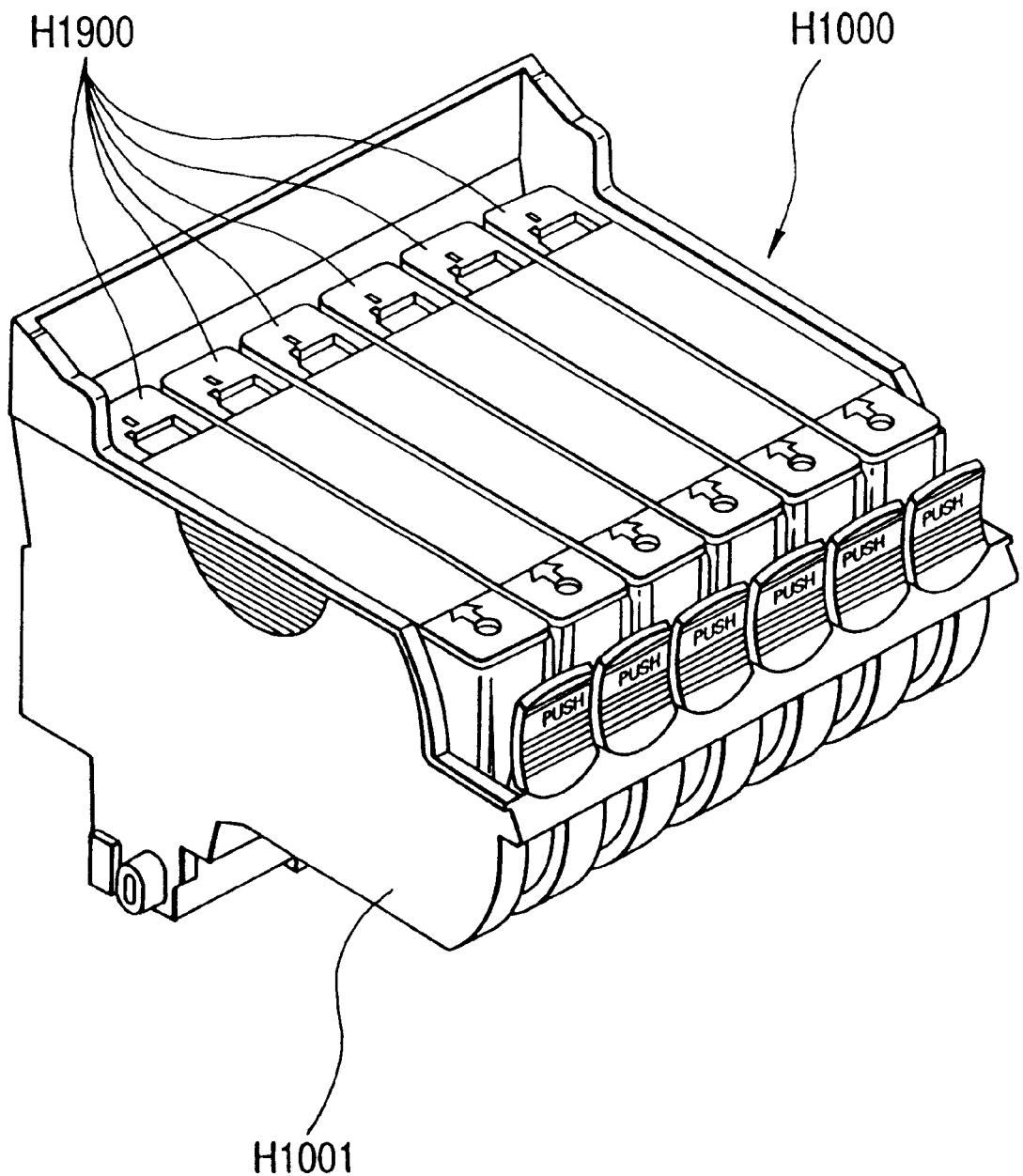
FIG. 3 is an oblique view of one embodiment of the assembled recording head cartridge of the present invention.
Figure 4:
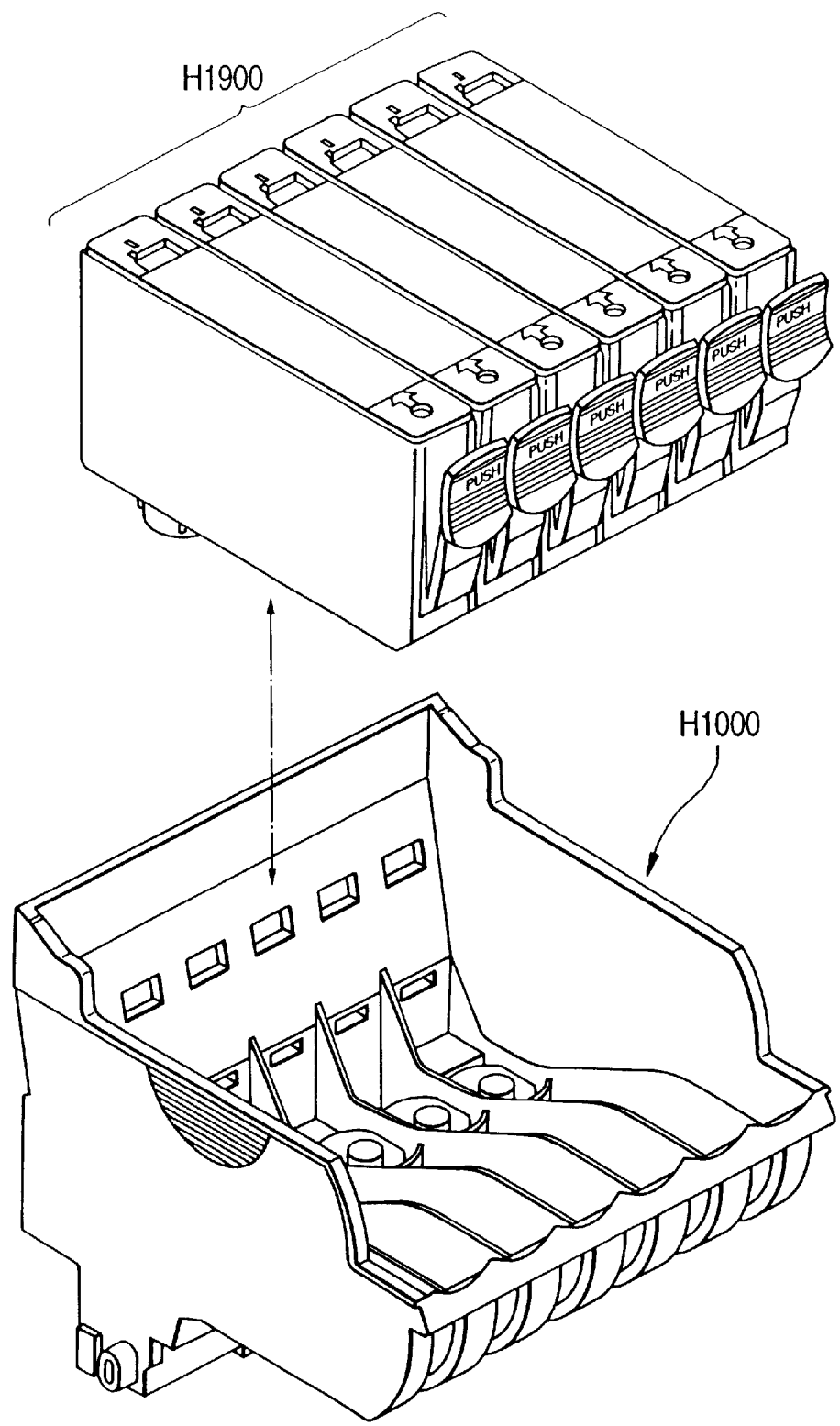
FIG. 4 is an oblique view of the disassembled recording head cartridge shown in FIG. 3.
Figure 5:
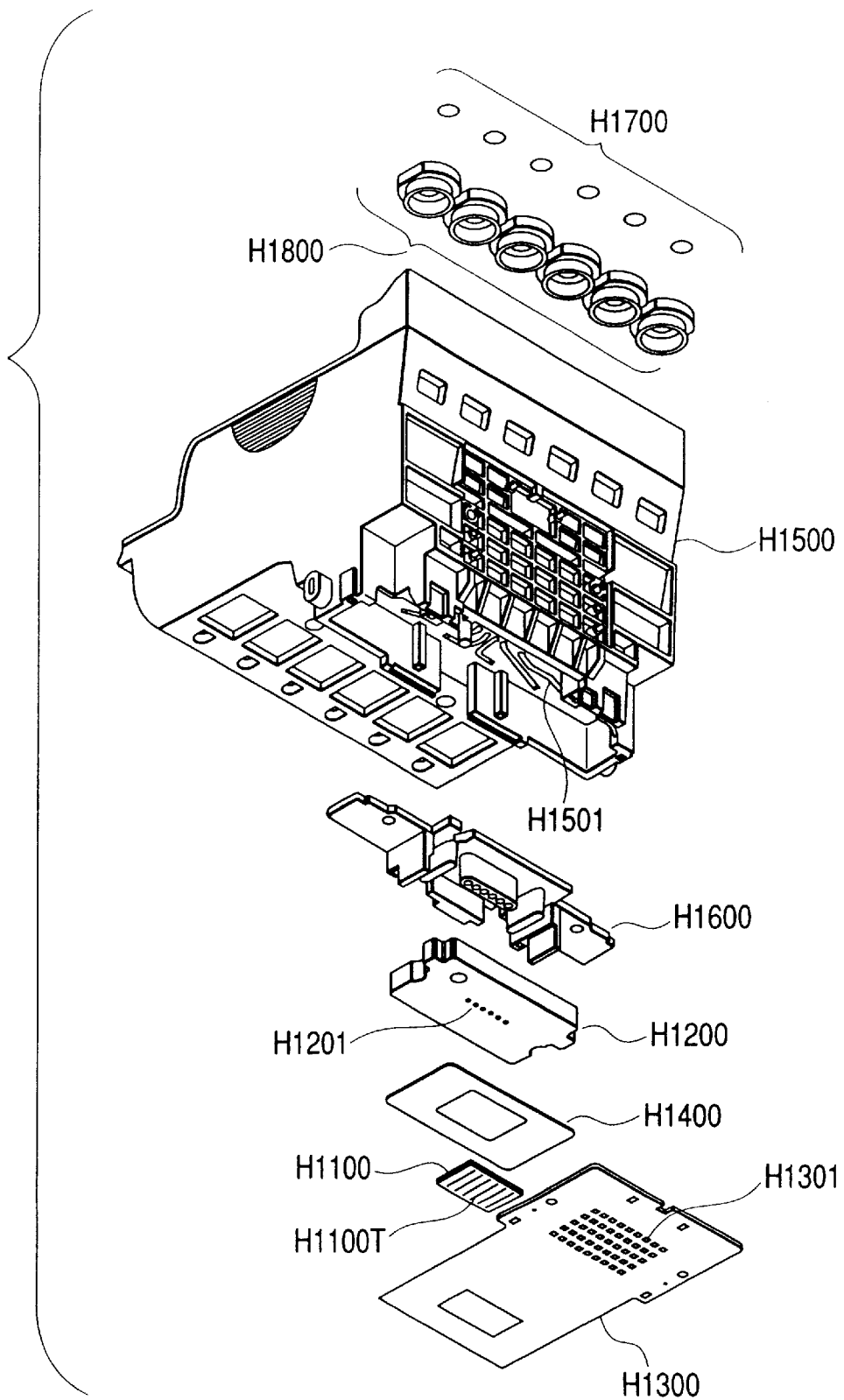
FIG. 5 is the disassembled recording head cartridge shown in FIG. 4, viewed obliquely upward.

The recording head cartridge is described by referring to FIGS. 3 to 5.

Referring to FIG. 3, the recording head cartridge H1000 of this embodiment comprises the ink tank H1900 which holds an ink, and recording head H1001 which discharges the ink supplied from the ink tank H1900 through the nozzle in accordance with recording information, the recording head H1001 being releasably supported by the carriage M4001, described later (the so-called cartridge mode).

For the recording head cartridge H1000 shown in the figure, ink tanks are provided each holding, e.g., a black, light cyan, light magenta, cyan, magenta or yellow color, to produce photographic type high-quality colored images, each tank being releasably attached to the recording head H1001, as shown in FIG. 4.

The recording head cartridge H1001 comprises (see the oblique view of the disassembled cartridge, shown in FIG. 5) the recording device substrate H1100, first plate H1200, electrical wiring substrate H1300, second plate H1400, tank holder H1500, passage-forming member H1600, filter H1700, and seal rubber H1800.

The recording device substrate H1100 supports a plurality of recording devices on one side of the Si substrate and electrical wires Al and the like for supplying power to each recording device, both formed by film-making techniques; a plurality of ink passages, each corresponding to each recording device, and discharge ports H1100T, both formed by photolithographic techniques; and a plurality of ink supply ports, each corresponding to each ink passage, opened toward the back side. The recording device substrate H1100 is fixed on the first plate H1200 by an adhesive, where the ink supply port H1201 is formed to supply the ink to the recording device substrate H1100. The second plate H1400 with an opening is fixed on the first plate H1200 by an adhesive, and supports the electrical wiring substrate H1300 in such a way to electrically connect the substrate H1300 to the recording device substrate H1100. The electrical wiring substrate H1300 applies an electrical signal to the recording device substrate H1100 for discharging the ink, and has the electrical wiring circuit, corresponding to the recording device substrate H1100, and the external signal inputting terminal H1301 located at the end of the electrical wiring circuit to receive an electrical signal from the apparatus body, wherein the external signal inputting terminal H1301 is set on the back side of the tank holder H1500, described later, at a given position.

The passage-forming member H1600 is joined, by ultrasonic fusing, to the tank holder H1500 which relesably holds the ink tank H1900, to form the ink passage H1501 extending from the ink tank H1900 to the first plate H1200. The ink passage H1501, connected to the ink tank H1900, is provided with the filter H1700 on the ink tank side, which prevents inflow of dust from the outside. It is sealed with the seal rubber H1800 at the joint with the ink tank H1900, to prevent vaporization of the ink from the joint.

The recording head H1001 is formed, as described earlier, by connecting, with the aid of adhesive or the like, the tank holder section to the recording device section, the former being composed of the tank holder H1500, passage-forming member H1600, filter H1700 and seal rubber H1800, and the latter the recording device substrate H1100, first plate H1200, electrical wiring substrate H1300 and second plate H1400.

Carriage

The carriage M4001 is described by referring to FIG. 2.

As shown, the carriage M4001 is provided with the carriage cover M4002 which is connected to the carriage M4001 to guide the recording head H1001 to a given position on the carriage M4001, and head set lever M4007 which is connected to the tank holder H1500 of the recording head H1001 and presses the recording head H1001 to set it at a given position.

More concretely, the head set lever M4007 is pivotally supported by the head set lever axis on the upper section of the carriage M4001, and provided with a head set plate (not shown) via a spring at the joint with the recording head H1001. This spring presses the recording head H1001 to attach it to the carriage M4001.

The carriage M4001 is also provided with the contact flexible print cable (hereinafter referred to as contact FPC) E0011 at another joint with the recording head H1001, where the contact section of the contact FPC E0011 is electrically connected to the contact section (external signal inputting terminal) H1301 on the recording head H1001, for various services, e.g., transmission/reception of various types of information for recording, and supplying power to the recording head H1001.

An elastic member, e.g., that of rubber (not shown), is placed between the contact section of the contact FPC E0011 and carriage M4001, to securely connect, together with the spring of the head set lever M4007, the contact section to the carriage M4001. The contact FPC E0011 is also connected to the carriage substrate E0013 supported by the back side of the carriage M4001 (see FIG. 7).

[Scanner]

The printer of this embodiment can also serve as a reader, when the recorder is replaced by the scanner shown.

This scanner moves with the carriage on the printer side, and reads manuscript images, sent in place of a recording medium, in the auxiliary scanning direction. The reading and manuscript sending are alternately effected, to read a sheet of manuscript image information.

FIGS. 6A and 6B outline the structure of the scanner M6000.

As shown, the scanner holder M6001 is box-shaped, holding therein an optical system, processing circuits and the like required for the reading service. The scanner M6000 is provided, when to be incorporated in the carriage M4001, with the scanner reading lens M6006 facing the manuscript surface, by which the image is read out. The scanner illuminating lens M6005 holds a light source (not shown) therein, from which light is emitted onto the manuscript.

The scanner holder M6001 is provided with the scanner cover M6003, which is fit into the bottom to shield light for the scanner holder M6001 inside and can be attached to, or detached from, the carriage M4001 by a louver-shaped holder provided on the scanner holder M6001 side. The scanner holder M6001 has an external shape almost the same as that of the recording head H1001, and can be releasably attached to the carriage M4001 in a manner similar to that for the recording head cartridge H1000.

The scanner holder M6001 holds the substrate provided with the above-described processing circuit in such a way that the scanner contact PCB connected to the substrate is exposed to the outside, and that the scanner contact PCB M6004 comes into contact with the contact FPC E0011 of the carriage M4001, when the scanner M6000 is attached to the carriage M4001, to electrically connect the above-described substrate to the control system of the apparatus body via the carriage M4001.

Next, the electrical circuit structure for one embodiment of the present invention is described.

Figure 7:
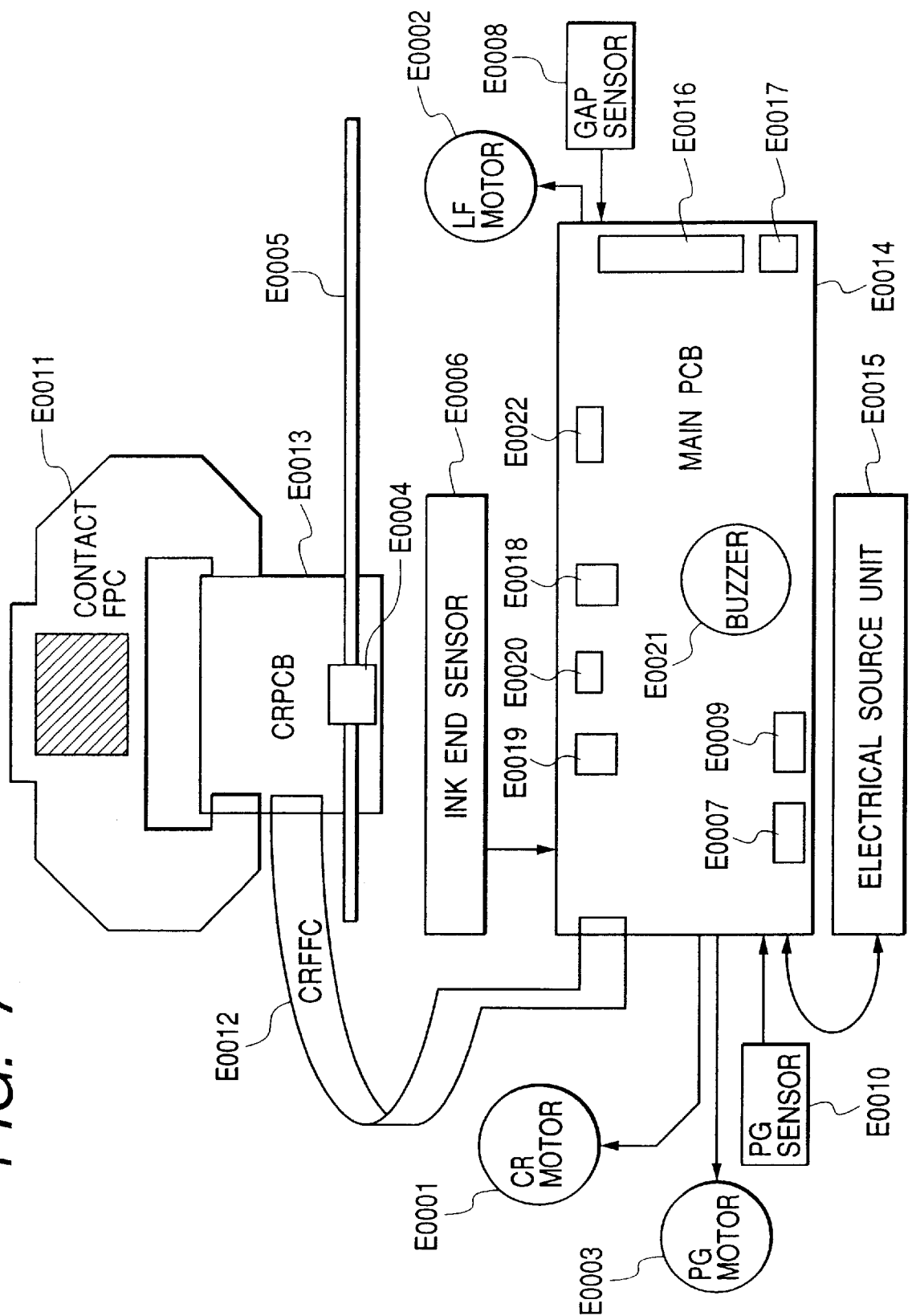
FIG. 7 is a block diagram schematically showing one embodiment of the whole structure of electrical circuit for the present invention.

FIG. 7 is a block diagram schematically showing the whole structure of electric circuit for this embodiment.

The major components of this electrical circuit include the carriage substrate (CRPCB) E0013, main PCB (printed circuit board) E0014, and electrical source unit E0015.

The electrical source unit E0015 is connected to the main PCB E0014, to supply power for driving various devices.

The carriage substrate E0013 is a print substrate unit supported by the carriage M4001 (see FIG. 2), to provide various services, functioning as the interface for transmission/reception of the signals with the recording head via the contact FPC E0011, detecting changed positional relationship between the encoder scale E0005 and encoder sensor E0004, based on the pulse signals outputted from the encoder sensor E0004 as the carriage M4001 moves, and transmitting the outputted signals to the main PCB E0014 via the flexible flat cable (CRFFC) E0012.

The main PCB is the print substrate unit responsible for controlling various components of the ink jet recording apparatus of this embodiment. It has I/O ports thereon for, e.g., the paper end sensor (PE sensor) E0007, ASF sensor E0009, cover sensor E0022, parallel interface (parallel I/F) E0016, serial interface (serial I/F) E0017, resume key E0019, LED E0020, electrical source key E0018, and buzzer E0021; is connected to the CR motor E0001, LF motor E0002 and PG motor E0003 to control them; and has the connection interfaces with the ink end sensor E0006, GAP sensor E0008, PG sensor E0010, CRFFC E0012 and electrical power unit E0015.

Figures 8, 8A:
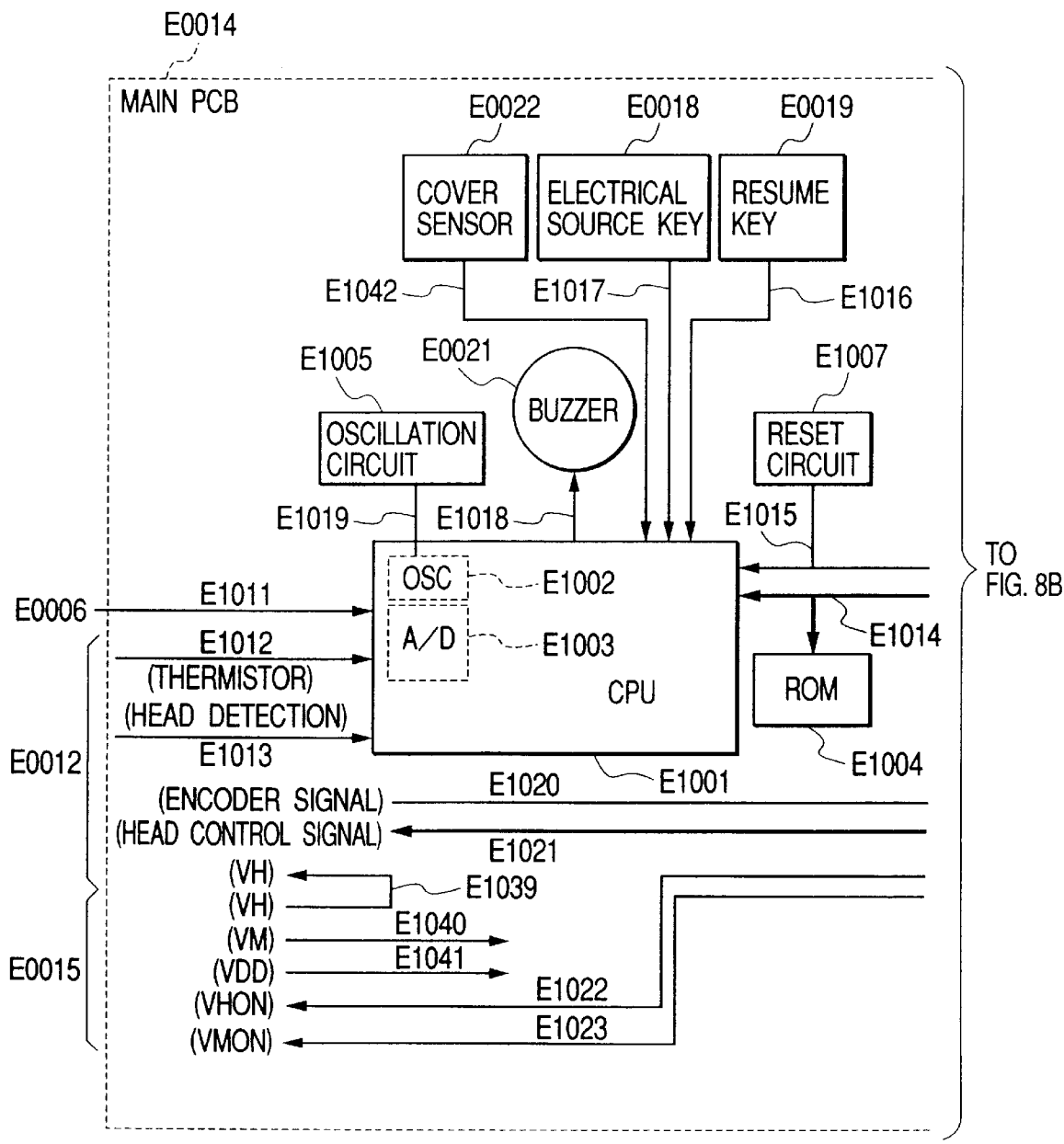
FIG. 8, which is comprised of FIGS. 8A and 8B, is a block diagram showing the internal structure of main PCB shown in FIG. 7.
Figure 8B:
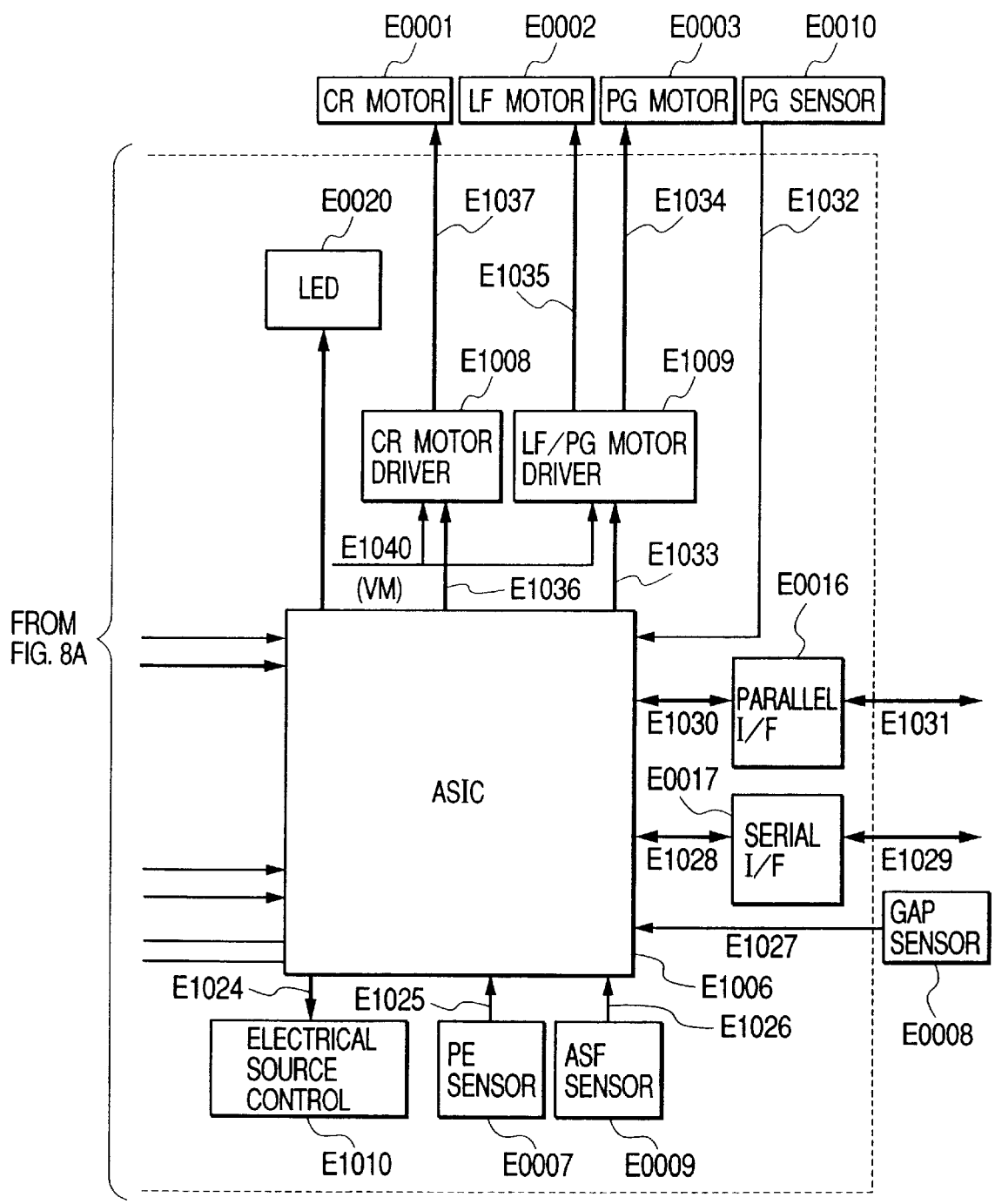

FIGS. 8A and 8B are block diagrams showing the internal structure of the main PCB.

In FIGS. 8A and 8B, the device of E1001 is the CPU, which holds therein the oscillator (OSC) E1002, and is connected to the oscillation circuit E1005, to generate a system clock by the signal E1019 outputted therefrom. It is also connected to the ROM E1004 and ASIC (application specific integrated circuit) E1006 via the control bus E1014, for driving or controlling various components of the ink jet recording apparatus; e.g., controlling the ASIC, and detecting conditions of the input signal E1017 from the electrical source key, input signal E1016 from the resume key, cover detecting signal E1042 and head detecting signal (HSENS) E1013, following the programs stored in the ROM; driving the buzzer E0021, following the buzzer signal (BUZ) E1018; detecting conditions of the ink end detection signal (INKS) E1011 to be transmitted to the built-in A/D converter E1003 and thermistor temperature detection signal (TH) E1012; and performing various logic calculations and judging various conditions.

The head detection signal E1013 includes the head-carried detection signals inputted from the recording head cartridge H1000 via the flexible flat cable E0012, carriage substrate E0013 and contact flexible print cable E0011. The ink end detection signal is the analogue signal outputted from the ink end sensor E0006, and thermistor temperature detection signal E1012 is the analogue signal from the thermistor (not shown) provided on the carriage substrate E0013.

The CR motor driver E1008 is driven by power supplied from the motor electrical source (VM) E1040, to generate the CR motor driving signal E1037, based on the CR motor control signal E1036 sent from the ASIC E1006, and drives the CR motor E0001. The LF/PG motor driver E1009 is driven by power supplied from the motor electrical source E1040, to generate the LF motor driving signal E1035, based on the pulse motor control signal (PM control signal) E1033 sent from the ASIC E1006, drives the LF motor based on the signal, and also generates the PG motor driving signal E1034 to drive the PG motor.

The electrical source control circuit E1010 controls power to be supplied to, e.g., sensors having a light-emitting device, based on the electrical source control signal E1024 sent from the ASIC E1006. The parallel I/F E0016 transmits the parallel I/F signal E1030 sent from the ASIC E1006 to the parallel I/F cable E1031 connected to the outside, and also transmits the signal by the parallel I/F cable E1031 to the ASIC E1006. The serial I/F E0017 transmits the serial I/F signal E1028 sent from the ASIC E1006 to the serial I/F cable E1029 connected to the outside, and also transmits the signal by the serial I/F cable E1029 to the ASIC E1006.

The electrical source unit E0015 supplies power to the head electrical source (VH) E1039, motor electrical source (VM) E1040, and logic electrical source (VDD) E1041. The head electrical source ON signal (VHON) E1022 and motor electrical source ON signal (VMOM) E1023, sent from the ASIC E1006, are inputted in the electrical source unit E0015, to control ON/OFF of the head electrical source E1039 and motor electrical source E1040, respectively. The logic electrical source (VDD) E1041, supplied from the electrical source unit E0015, is supplied to various devices inside and outside of the main PCB E0014, after its voltage is converted, as required.

The head electrical source E1039 is sent to the flexible flat cable E0011, after being leveled on the main PCB E0014, to be used for driving the recording head cartridge H1000.

The reset circuit E1007 detects the logic electrical source voltage E1040, when it is lowered, and sends the reset signal (RESET) E1015 to the CPU E1001 and ASIC E1006 for initialization.

The ASIC E1006 is a one-chip semiconductor integrated circuit, and is controlled by the CPU E1001 via the control bus E1014. It outputs, e.g., the CR motor control signal E1036, PM control signal E1033, electrical source control signal E1024, head electrical source ON signal E1022 and motor electrical source ON signal E1023; is in communication with the parallel I/F E0016 and serial I/F E0017 for signals; and detects conditions of the PE-detected signal (PES) E1025 from the PE sensor E0007, AFS-detected signal (ASFS) E1026 from the ASF sensor E0009, GAP-detected signal (GAPS) E1027 from the GAP sensor E0008 and PG-detected signal (PGS) E1032 from the PG sensor E0007, and transmits the conditional data to the CPU E1001 via the control bus E1014, the CPU E1001 controlling the driving of LED driving signal E1038, based on the data it receives, to flicker the LED E0020.

The ASIC E1006 also detects conditions of the encoder signal (ENC) E1020 to generate the timing signal, and keeps interface with the recording head cartridge H1000 by the head control signal E1021 to control its recording action, where the encoder signal (ENS) E1020 is outputted by the CR encoder sensor E0004 to be sent to the ASIC E1006 via the flexible flat cable E0012. The head control signal E1021 is sent to the recording head H1000 via the flexible flat cable E0012, carriage substrate E0013 and contact FPC E0011.

Figures 9, 9A:
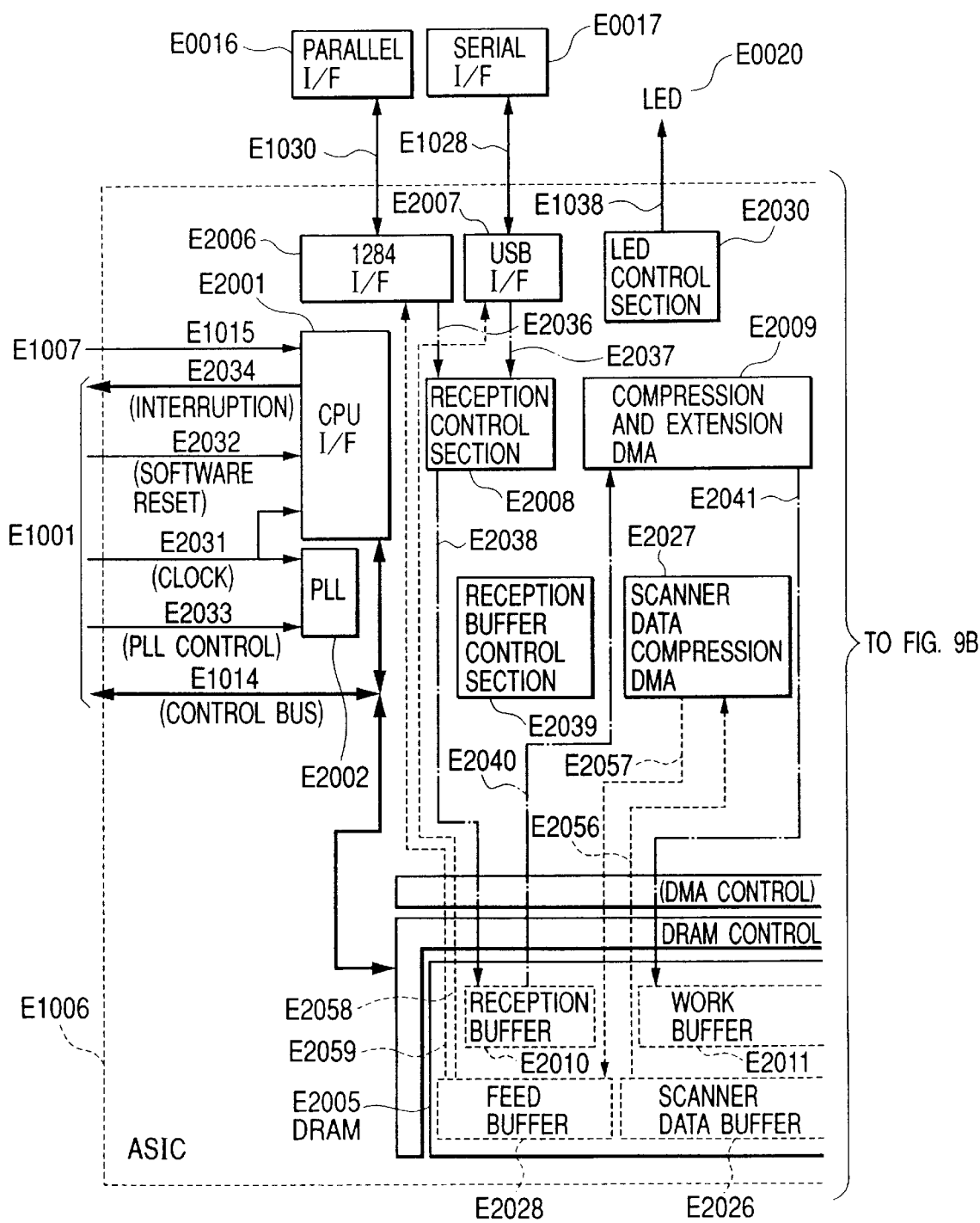
FIG. 9, which is comprised of FIGS. 9A, 9B and 9C, is a block diagram showing the internal structure of ASIC shown in FIGS. 8A and 8B.
Figure 9B:
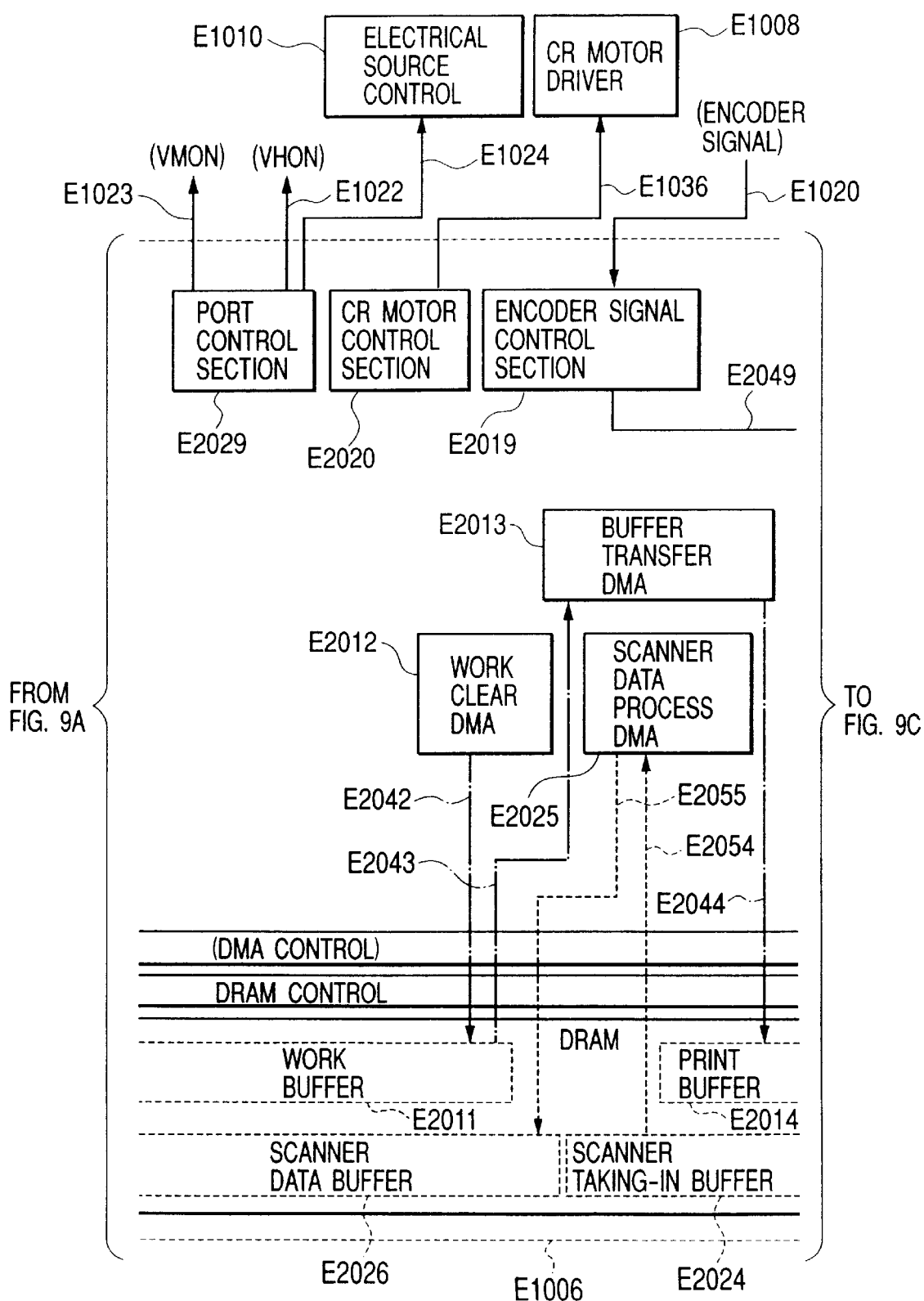
Figure 9C:
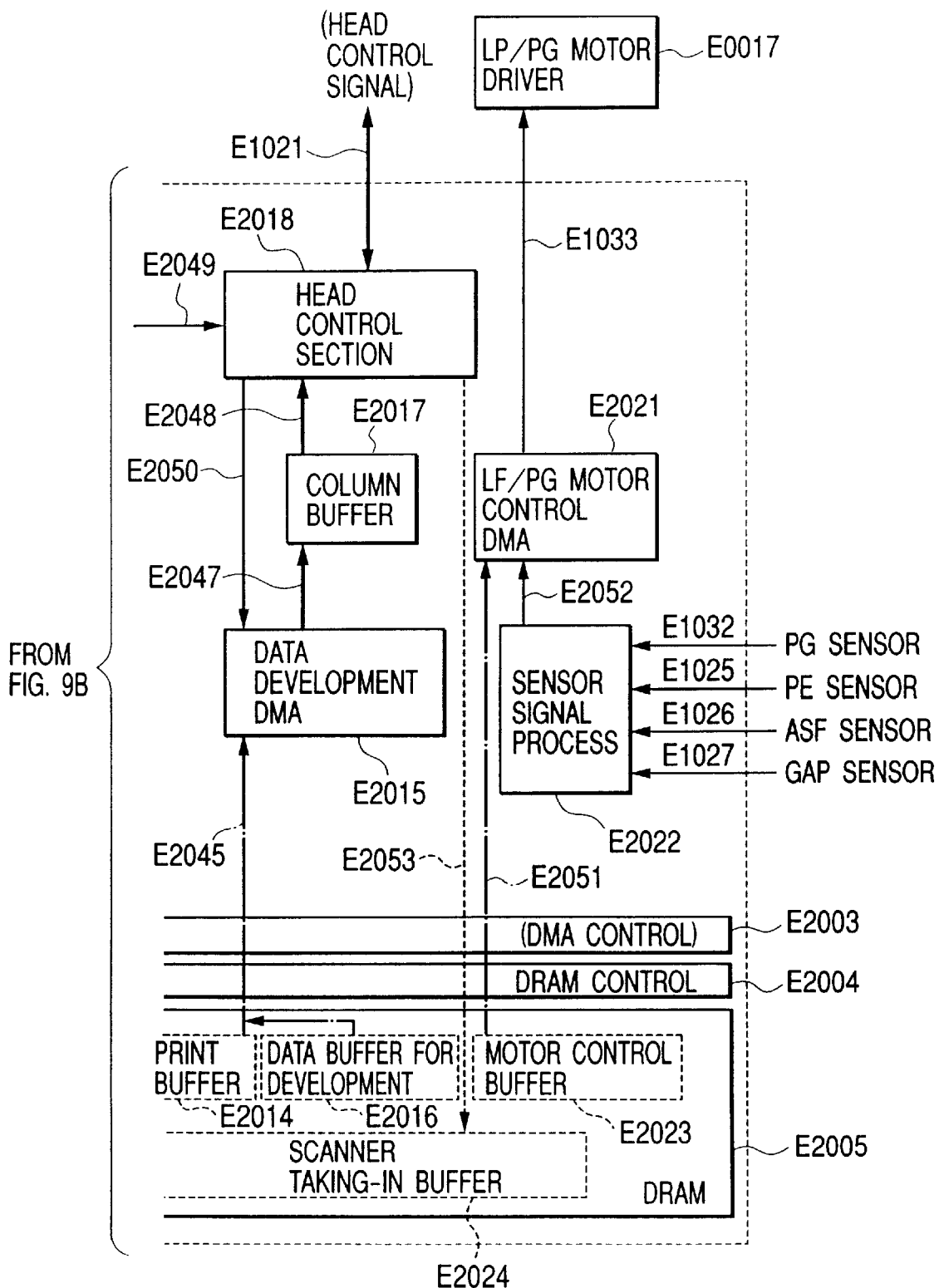

FIGS. 9A to 9C are block diagrams showing the internal structure of the ASIC E1006.

FIGS. 9A to 9C only show the data flows related to controlling the head and mechanism components, e.g., data for recording and motor controlling, and omits other control signals, e.g., those related to reading/writing resistors (these data are stored in the blocks), and also to clocks and DMA controlling, to avoid complication of the drawing.

The PLL E2002 generates, based on the clock signal (CLK) E2031 from the CPU E1001 and PLL control signal (PLLON) E2033 as shown in FIGS. 9A to 9C, clocks (not shown) to be supplied to most parts in the ASIC E1006.

The CPU interface (CPU I/F) E2001 provides various functions, based on the reset signal E1015, shift reset signal (PDWN) E2032 outputted by the CPU E1001, clock signal (CLK) E2031 and control signal sent from the control bus E1014, e.g., controlling resistor reading/writing for each block, described later, supplying clocks to some blocks, receiving interruption signal (not shown), outputting interruption signal (INT) E2034 for the CPU E1001, and informing interruption in the ASIC E1006.

The DRAM E2005 has a variety of regions, e.g., those for reception buffer E2010, work buffer E2011, print buffer E2014 and data buffer for development E2016 as the recording data buffers; motor control buffer E2023 for motor controlling; and scanner takingin buffer E2024, scanner data buffer E2026 and feed buffer E2028 as those to be used during scanner action mode, in place of the above-described recording data buffers.

The DRAM E2005 is also used as the work region required for the actions of the CPU E1001. The DRAM control section E2004 switches the access from the CPU E1001 to the DRAM E2005 by the control bus to the access from the DMA control section E2003, described later, to the DRAM E2005, to perform the reading/writing actions for the DRAM E2005.

The DMA control section E2003 outputs, on receiving the request (not shown) from each block, the address or control signal (not shown), or, in the case of the writing action, data for writing (E2038, E2041, E2044, E2053, E2055 and E2057) for the RAM control section, to make access to the DRAM. In the case of the reading action, it sends the data for reading (E2040, E2043, E2045, E2051, E2054, E2056, E2058, E2059) from the DRAM control section E2004 to the block which has requested the data.

The 1284I/F E2006 is controlled by the CPU E1001 via the CPUI/F E2001 to serve as the interface for the bilateral communication with the external host device (not shown) via the parallel I/F E0016; transmits, in the case of the recording action, the data received from the parallel I/F E0016 (data E2036 received from PIF), after DMA-processing them, to the reception control section E2008; and transmits, in the case of the scanner reading action, the data stored in the feed buffer E2028 (1284-transmitted data (PDPIF) E2059) in the DRAM E2005 to the parallel I/F, after DMA-processing them.

The USBI/F E2007 is controlled by the CPU E1001 via the CPUI/F E2001 to serve as the interface for the bilateral communication with the external host device (not shown) via the serial I/F E0017; transmits, in the case of the printing action, the data received from the serial I/F E0017 (USB-received data E2037), after DMA-processing them, to the reception control section E2008; and transmits, in the case of the scanner reading action, the data stored in the feed buffer E2028 (USB-transmitted data (RDUSB) E2058) in the DRAM E2005 to the serial I/F E0017, after DMA-processing them. The reception control section E2008 writes the data ((WDIF) E2038) received from the selected I/F (1284I/F E2006 or USBI/F E2007) in the reception buffer writing address, controlled by the reception buffer control section E2039.

The compression and extension DMA E2009 is controlled by the CPU E1001 via the CPUI/F E2001 to read the received data (raster data), stored in the reception buffer E2010, from the reception buffer reading address, controlled by the reception buffer control section E2039; and compresses and extends the data (RDWK) E2040 following the designated mode; and writes them as the recording code rows (WDWK) E2041 in the work buffer region.

The recording buffer transfer DMA E2013 is controlled by the CPU E1007 via the CPUI/F E2001 to read the recorded code (RDWP), stored in the work buffer E2011, and transfers these code (WDWP E2044) to the recording head cartridge H1000, after rearranging the recorded codes, in accordance with the addresses on the print buffer E2014, in the data transfer order to be suited for transfer. The work area DMA E2012 is controlled by the CPU E1001 via the CPUI/F E2001 to write the designated work fill data (WDWF) E2042 repeatedly in the region on the work buffer, to which data have been transferred completely by the recording buffer transfer DMA E2015.

The DMA for development of recording data E2015 is controlled by the CPU E1001 via the CPUI/F E2001 to read, with the data development timing signal E2050 sent from the head control section E2018 as the trigger, the recorded codes rearranged and wrote on the print buffer and data for development wrote on the data buffer for development E2016 to produce the developed recording data (RDHDG) E2045, and writes them on the column buffer E2017 as the column buffer writing data (WDHDG) E2047. The column buffer E2017 serves as the SRAM which temporarily stores the data (recording data for development) to be transferred to the recording head cartridge H1000, and is commonly controlled by two blocks of the DMA for development of recording data and head control section with the hand shake signal (not shown).

The head control section E2018 is controlled by the CPU E1001 via the CPUI/F E2001 to serve as the interface with the recording head cartridge H1000 or scanner via the head control signal, and to transmit the data development timing signal E2050 to the DMA for development of recording data E2015, based on the head drive timing signal E2049 sent from the encoder signal processing section E2019.

For printing, it reads the developed recording data (RDHD) E2048 from the column buffer, based on the head drive timing signal E2049, and transmits the data to the recording head cartridge H1000 by the head control signal E1021.

In the scanner reading mode, it transfers the data (WDHD) E2053 taken-in via the head control signal E1021 to the scanner taking-in buffer E2024 on the DRAM E2005 (DMA transfer). The scanner data processing DMA E2025 is controlled by the CPU E1001 via the CPUI/F E2001 to read the taking-in buffer reading data (RDAV) E2054, stored in the scanner taking-in buffer E2024, process them by leveling or the like, and write the processed data (WDAV) E2055 on the scanner data buffer E2026 on the DRAM E2005.

The scanner data compression DMA E2027 is controlled by the CPU E1001 via the CPUI/F E2001 to read the processed data (RDYC) E2056 on the scanner data buffer E2026, compress them, and write the compressed data (WDYC) E2057 in the feed buffer E2028 for transfer.

The encoder signal processing section E2019 outputs, on receiving the encoder signal (ENC), the head drive timing signal E2049 in accordance with the mode controlled by the CPU E1001. It also stores, in the resistor, information related to position and speed of the carriage M4001, obtained by the encoder signal E1020, and supplies these data to the CPU E1001. CPU E1001 determines, based on these data, various parameters for controlling the CR motor E0001. The CR motor control section E2020 is controlled by the CPU E1001 via the CPUI/F E2001 to output the CR motor control signal E1036.

The sensor signal processing section E2022 receives various detected signals sent from, e.g., PG sensor E0010, PE sensor E0007, ASF sensor E0009 and GAP sensor E0008, and transmits these sensor-detected signals to the CPU E1001 in accordance with the mode controlled by the CPU E1001. It also transmits the sensor-detected signal E2052 to the LF/PG motor control section DMA E2021.

The LF/PG motor control DMA E2021 is controlled by the CPU E1001 via the CPUI/F E2001 to read the pulse motor driving table (RDPM) E2051 from the motor control buffer E2023 on the DRAM E2005, and outputs the pulse motor control signal E1033. It also outputs the pulse motor control signal E1033, with the sensor-detected signal as the trigger, depending on an action mode.

The LED control section E2030 is controlled by the, CPU E1001 via the CPUI/F E2001 to output the LED driving signal E1038. The port control section E2029 is controlled by the CPU E1001 via the CPUI/F E2001 to output the head electrical source ON signal E1022, motor electrical source ON signal E1023, and electrical source control signal E1024.

Figure 10:
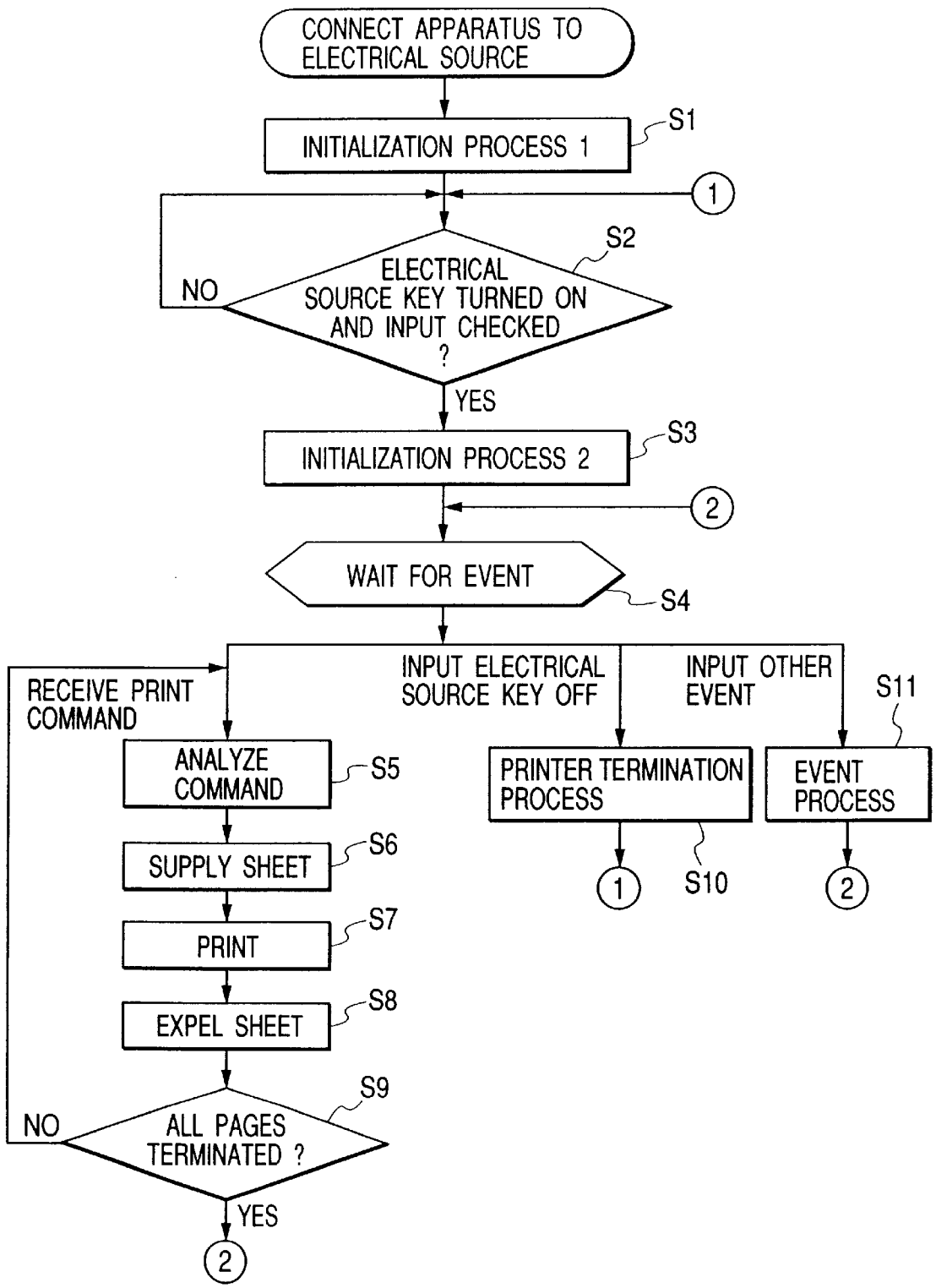
FIG. 10 is a flow chart showing actions of one embodiment of the present invention.

The actions of one embodiment of the ink jet recording apparatus of the present invention, outlined above, are described by the flow chart shown in FIG. 10.

The first initialization processing step (S1) starts, when this apparatus is connected to an AC electrical source, to check the electrical circuit systems of this apparatus, e.g., those for ROM and RAM, and thereby to confirm that the apparatus is normally operable electrically.

The step S2 judges whether the electrical source key E0018 on the upper case M1002 which covers the apparatus body M1000 is switched on, and the step S3 starts when the electrical source key E0018 is pushed down for the second initialization.

The second initialization processing step checks the driving mechanisms and the head system of the apparatus, confirm whether the apparatus is normally operable for initialization of the motors and reading head information.

The step S4 waits for an event, watching, e.g., instruction events via external I/F's for the apparatus, panel key event triggered by the user, and internal control events, and, when an event occurs, starts the apparatus to process the job instructed by the event.

For example, the printing instruction event is received via an external I/F in the step S4, the step S5 starts. When the electrical source key event by the user occurs in the step S5, the step proceeds to the step S10, and to the step S11 when another event occurs in the step S10.

The step S5 analyzes the printing instruction sent via an external I/F; recognizes the designated paper type, paper size, printing quality, paper supply method and the like; stores the data of the recognized results in the RAM E2005 in the apparatus; and starts the step S6.

The step S6 starts supplying papers by the method instructed from the step S5; send the paper to a given record-starting position; and starts the step S7.

The step S7 is a recording step, where it temporarily stores the recording data sent from an external I/F in the recording buffer; drives the CR motor E0001 to move the carriage M4001 in the scanning direction; supplies the recording data stored in the print buffer E2014 to the recording head H1001 to record one line; drives the LF motor E0002, when the action for recording the data for one line is completed, to send the paper in the auxiliary scanning direction by rotating the LF roll M3001; repeats the above actions until the action for recording the data, sent from the external I/F, for one page is completed; and starts the step S8.

The step S8 drives the LE motor E0002 and paper discharge roller M2003, to repeat the paper-sending action until the papers are judged to be completely sent out of the apparatus. The papers are totally discharged onto the paper discharge tray M1004a, when this step is completed.

The step S9 judges whether the action for recording all of the pages to be recorded is completed or not; returns the step back to the step S5 when one or more pages to be recorded are judged to remain. When the step is returned back to S5, the steps S5 to S9 are repeated, until the action for recording all of the pages to be recorded is completed. Then, the step is returned back to the step S4, to wait for a next event.

The step S10 stops the printer, and stops all of the actions of this apparatus. More concretely, it adjusts the electrical sources for the motors and head at the conditions ready for cutting, and cuts them; and starts the step S4 to wait for a next event.

The step S11 treats the events other than the above. For example, it corresponds to the recovery instructions sent from the panel keys of this apparatus and external I/F's, and internally generated recovery events. It starts the step S4 to wait for a next event, after the processing is completed.

The present invention is described more concretely by Examples.

EXAMPLE 1

Figure 11:
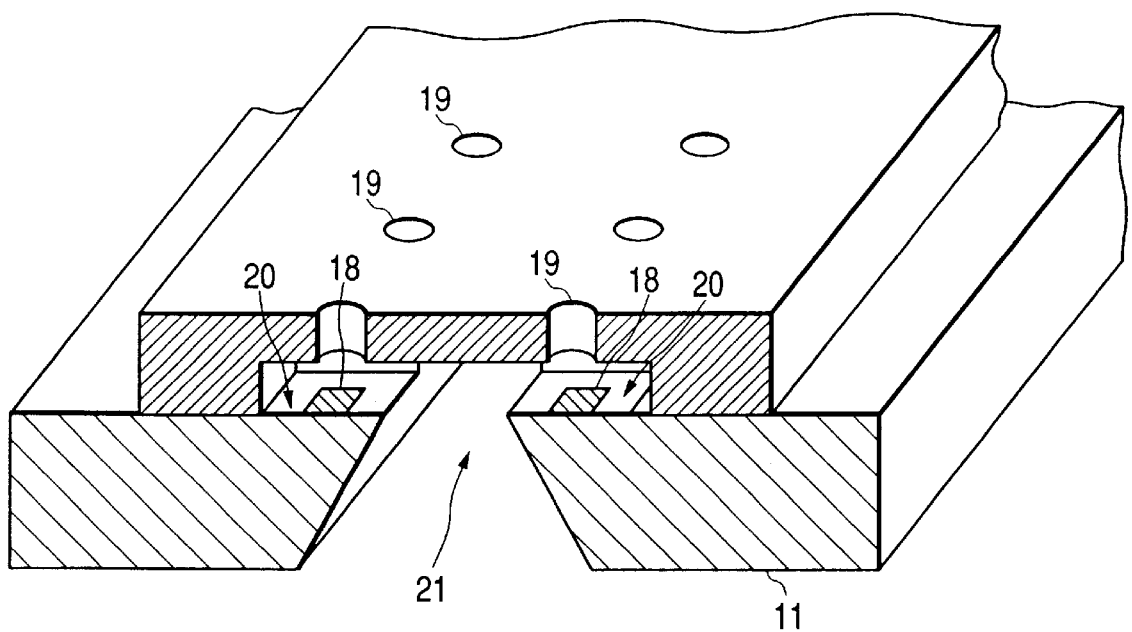
FIG. 11 is an oblique cutaway view outlining the structure of one embodiment of the present invention for liquid discharging head.
Figure 12:
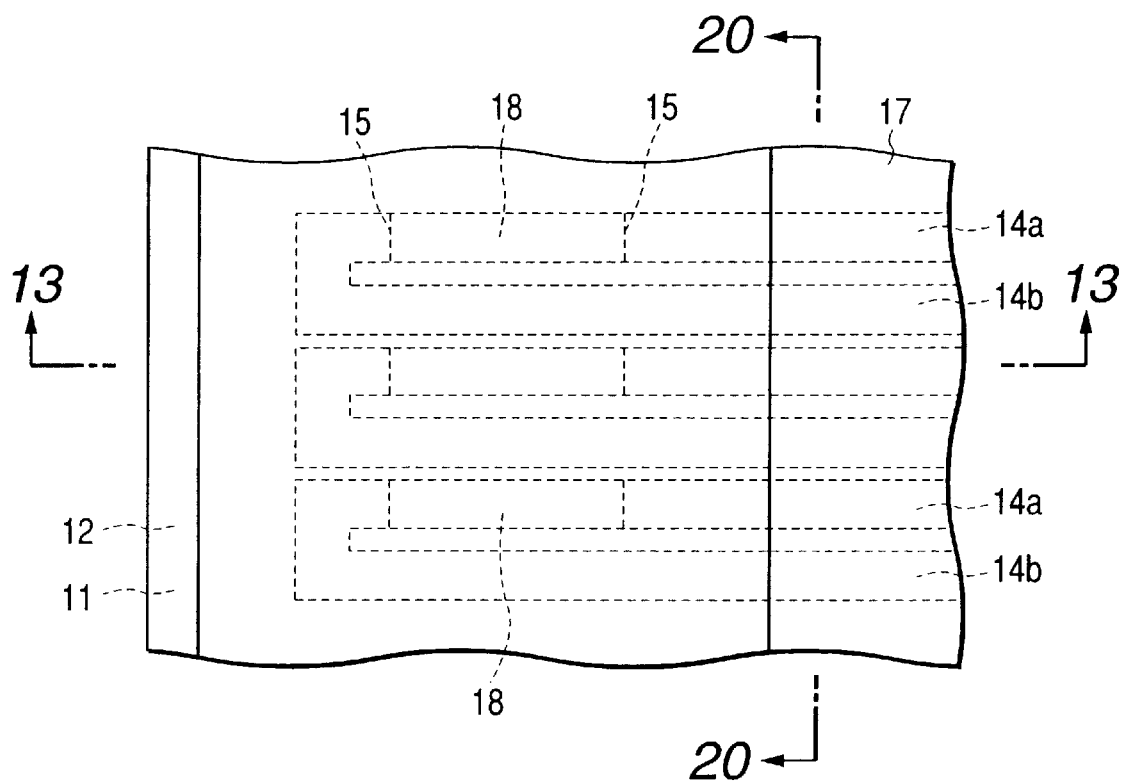
FIG. 12 is a plan view of the major section of the substrate for the embodiment shown in FIG. 11.
Figure 13:
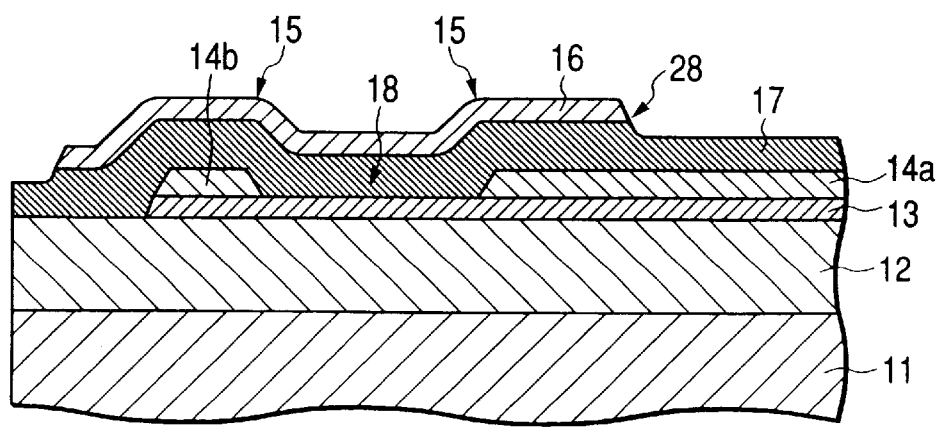
FIG. 13 is a 13—13 section of the plan view shown in FIG. 12.
Figure 20:
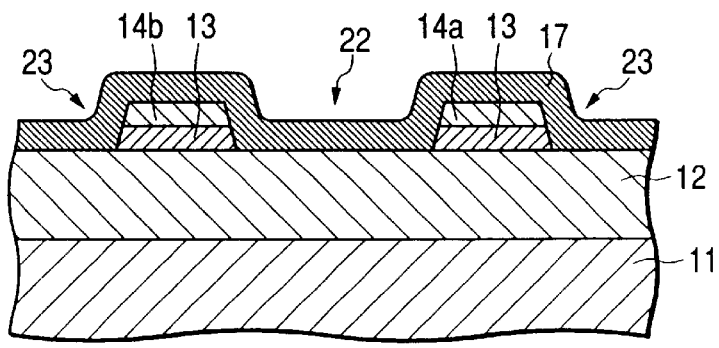
FIG. 20 is a 20—20 section of the plan view shown in FIG. 12.

Part of the recording head H1001 of Example 1 is shown in FIG. 11, which is a broken oblique view. The major part of its substrate unit is shown in FIG. 12, which is a plan view. FIGS. 13 and 20 show the 13—13 and 20—20 sections, respectively, of the plan view shown in FIG. 12; where, a substrate 11 as the recording device substrate H1100 supports the electrothermal transducer 18, which is formed by the heat generating resist layer 13 placed between a pair of the electrode wiring circuits 14a and 14b. The step 15 is formed by a pair of the electrode wiring circuits 14a and 14b to stand on the heat generating resist layer 13. They are protected by the first protective layer 17 and second protective layer 16. The discharge port 19, corresponding to the discharge port H1100T, discharges ink droplets. The ink is supplied to the ink chamber 20 via the ink supply port 21 (corresponding to the ink supply port H1201), opened in the substrate 11, and then supplied from the ink chamber 20 to the discharge port 19.

The substrate 11 is normally produced by the following procedures: the heat generating resist layer 13 and a pair of the electrode wiring circuits 14a and 14b are normally patterned on an Si wafer by photolithography; the ink chamber 20 and the discharge port 19 are made of a photosensitive resin; the ink supply port 21 is formed by anisotropic etching or the like; and the Si wafer is cut off. The electrical wiring substrate H1300 (see FIG. 5), responsible for transmitting/receiving the electrical signal to drive the electrothermal transducer 18, is connected to the substrate 11 by a mounting technique. The electrical wiring substrate H1300 supports driving devices, e.g., power transistor for electrically switching the electrothermal transducer 18 on or off, and CMOS logic circuit for controlling the power transistor, formed by the semiconductor techniques to be connected to the electrothermal transducer 18 via a pair of the electrode wiring circuits 14a and 14b.

In this example, the discharge ports 19 were formed in two rows running in parallel to each other sandwiching the ink supply port 21, each port in one row being off the corresponding one in the other row by half a pitch, and the ink chambers 20 were arranged at intervals of 600 dpi for the corresponding discharge ports 19.

Each of the ink chambers 20 was provided with the electrothermal transducer 18, to discharge the ink droplets from the discharge port 19 at 4 picoliter.

In this example, the substrate 11 was made of an Si wafer, which was thermally oxidized to form the oxide layer 12 as a several $\mu$m thick $SiO_2$ film. It was then coated with the heat generating resist layer 13 (around 500 Å thick) by sputtering. In this example, the heat generating resist layer 13 was made of TaN, which may be replaced by, e.g., $HfB_2$ or TaSiN. Next, the Al layer for a pair of the electrode wiring circuits 14a and 14b was formed to a thickness of around 2100 Å with a tolerance of ±300 Å, and patterned on the wiring region using a mask. In this example, the electrode wiring circuits 14a and 14b were made of Al, which may be replaced by an alloy, e.g., Al—Si, Al—Cu or Al—si—Cu. The heat generating resist layer 13 and a pair of the electrode wiring circuits 14a and 14b were simultaneously treated by dry etching, and the electrothermal transducer 18 is patterned using a mask. Then, the Al layer in the electrothermal transducer 18 area was removed by wet etching.

Thickness of the Al layer for a pair of the electrode wiring circuits 14a and 14b was decreased to around 2100 Å. Decreasing the thickness increases wiring resistance, which increases power consumption and temperature of the substrate 11. Therefore, the conventional device has a thicker circuit.

However, resistance of the wiring circuit is much lower than that of the heat generating resist layer 13. It is demonstrated by verifying the results of Example 1 that decreasing thickness of the Al layer to the above level should not cause notable problems with respect to power loss or increased temperature of the substrate and that these disadvantages are well compensated by saved power, and improved thermal response and durability of the heat generating resist layer 13, which result from decreased thickness of the first protective layer 17 over the heat generating resist layer 13.

The minimum allowable thickness of the electrode wiring circuits 14a and 14b is largely determined by current density, which represents how much current flows for how long in the unit cross sectional area, which is determined by its width and thickness. It is generally well known that resistance of the material that constitutes the electrode wiring circuit 14a and 14b by electromigration increases as current density and conducting period increase.

It should be noted, however, that the electrode wiring circuits 14a and 14b over the substrate 11 are exposed to $3 \times 10^8$ to $1 \times 10^9$ conducting cycles, each lasting a very short time of 1 $\mu$min, at a repeated driving frequency of 30 kHz or so.

The substrate 11 of Example 1 was analyzed for electromigration at its electrode wiring circuits 14a and 14b. No change in resistance of these circuits was observed for $3 \times 10^9$ pulses under the conditions of current density of $1.5 \times 10^7$ A/cm, conducting pulse width of 1.3 $\mu$s and substrate temperature of constant 60° C.

The electrode wiring circuits 14a and 14b were coated with the first protective layer 17 of SiN, formed by CVD to a thickness of 3000 Å with a tolerance of ±400 Å. SiN may be replaced by silicon oxide.

Then, the second protective layer 16 of Ta was formed by sputtering to a thickness of 2300 Å with a tolerance of ±280 Å. Ta may be replaced by TaN or TaSiN.

The patterning was again effected, and unnecessary portion of the second protective layer 16 of Ta was removed by dry etching. Dry etching time was set for overetching, to prevent the second protective layer 16 from remaining in the cavity 22 between the heat generating resist layers 13 (and electrode wiring circuits 14a and 14b which were placed on the resist layers alternately) arranged in parallel to the direction of the electrothermal transducer 18 row. When the second protective layer 16 remains, and when there is a pinhole in the first protective layer 17 below the area where the second protective layer 16 remains (hereinafter referred to as the residual area), the wiring electrode and residual area are electrically connected to each other, to possibly oxidize the residual area. The necessary portion of the second protective layer 16 can be oxidized, when the current reaches there. If this occurs, the layer 16 may not provide protection against cavitation. In order to remove the unnecessary portion of the second protective layer 16 without leaving behind the residual area, the dry etching is effected preferably to an overetching extent of at least 100 Å. This overetching will make the first protective layer 17 thinner in the area where the second protective layer 16 is removed than in the area where Ta that constitutes the second protective layer 16 remains. The difference is preferably 200 Å or less, in order to securely protect the electrode wiring.

When the etchant gas is ejected at a right angle to the substrate 11 surface during the dry etching process, the first protective layer 17 around the step 23, formed by the heat generating resist layer 13 and electrode wiring circuits 14a and 14b placed on the resist layer 13 to stand on the substrate 11 surface (or oxide layer 12 surface, in the figure), is at an angle to the etchant gas ejection direction. This relaxes inflow of the etchant gas into the above portion of the first protective layer 17, even when it is cracked, preventing damages of the heat generating resist layer 13 and electrode wiring circuits 14a and 14b placed on the resist layer 13. It should be noted, however, that, when the first protective layer 17 is excessively removed by the overetching, the portion around the step 23 is etched faster than the others, because of its rougher film texture, to possibly cause damages of the electrode wiring circuits 14a and 14b.

Use of the anisotropic dry etching will more efficiently protect the electrode wiring circuits 14a and 14b placed on the resist layer 13 from damages, even when the first protective layer 17 around the step 23 standing on the substrate 11 is cracked.

Figure 14:
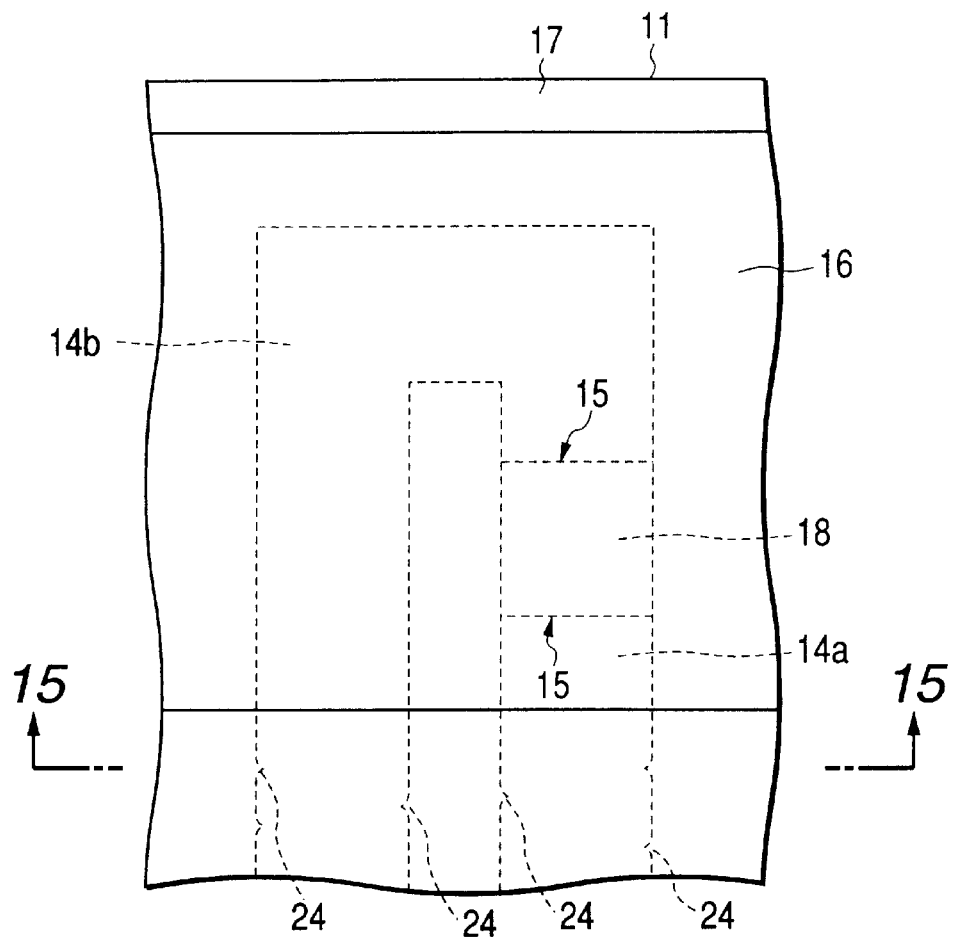
FIG. 14 is a plan view showing the major section of the substrate which supports a second protective layer formed by wet etching.
Figure 15:
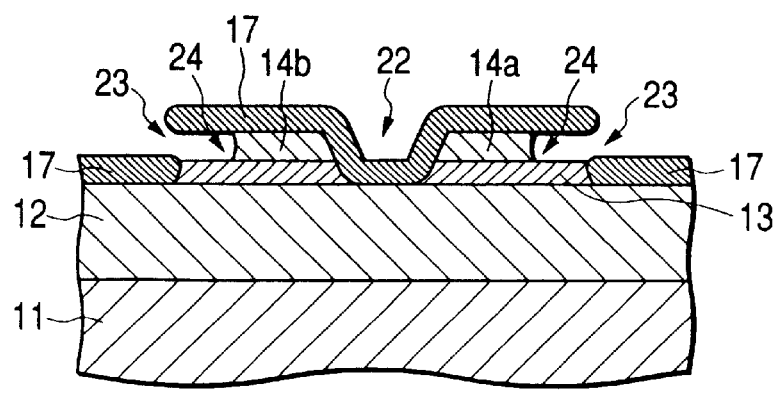
FIG. 15 is a 15—15 section of the plan view shown in FIG. 14.

FIG. 14 shows the substrate surface conditions wet-etched to remove the unnecessary portion of the second protective layer 16, and FIG. 15 shows the XV—XV section of the structure shown in FIG. 14, where the members shown in these figures are marked with the same numbers, when they are functionally corresponding to each other. It is found, when wet etching is used to remove the unnecessary portion of the second protective layer 16, that the etchant penetrates into the first protective layer 17 around the step 23 through the cracks, to etch the electrode wiring circuits 14a and 14b, producing the defect 24. On the other hand, when wet etching is used to remove the unnecessary portion of the second protective layer 16, as is for this embodiment of the present invention, the troubles of etching the electrode wiring circuits 14a and 14b are not observed, unlike the case of wet etching, whether or not the defects, e.g., pinholes or cracks, are present in the first protective layer 17.

In addition, the overetching by dry etching can taper the portion of the first protective layer covered by the second protective layer and portion of the first protective layer not covered by the second protective layer in the vicinity of the boundary between them. The tapered shape will be described more concretely in Example 2.

The recording head H1001 was produced by incorporating the above substrate unit, and exposed to cycles of ink injection to test its durability. Disconnection of the wiring for the heat generating resist layer 13 or other troubles were not observed for $1 \times 10^9$ cycles, as compared with $3 \times 10^8$ cycles or more set as the target. In this recording head H1001, the first protective layer 17 was approximately 1.14 times thicker than the layer of the electrode wiring circuit 14a or 14b.

EXAMPLE

Figure 21:
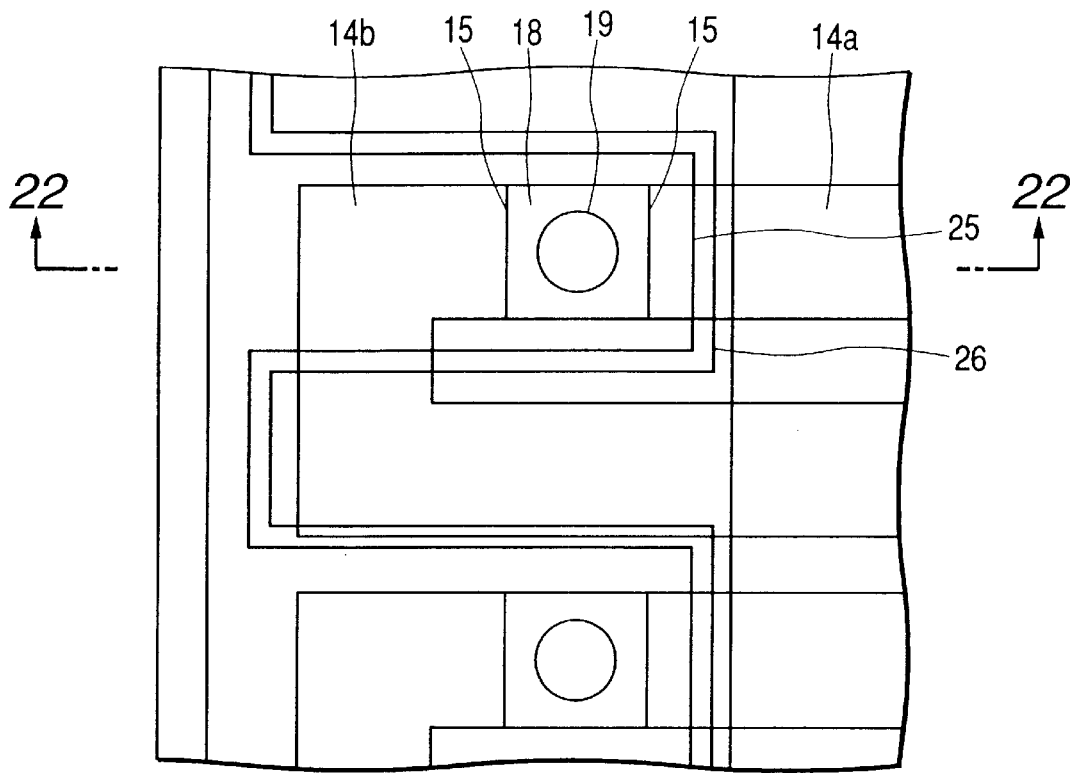
FIG. 21 is a plan view showing the major portion of one embodiment of the present invention for liquid discharging head.
Figure 22:
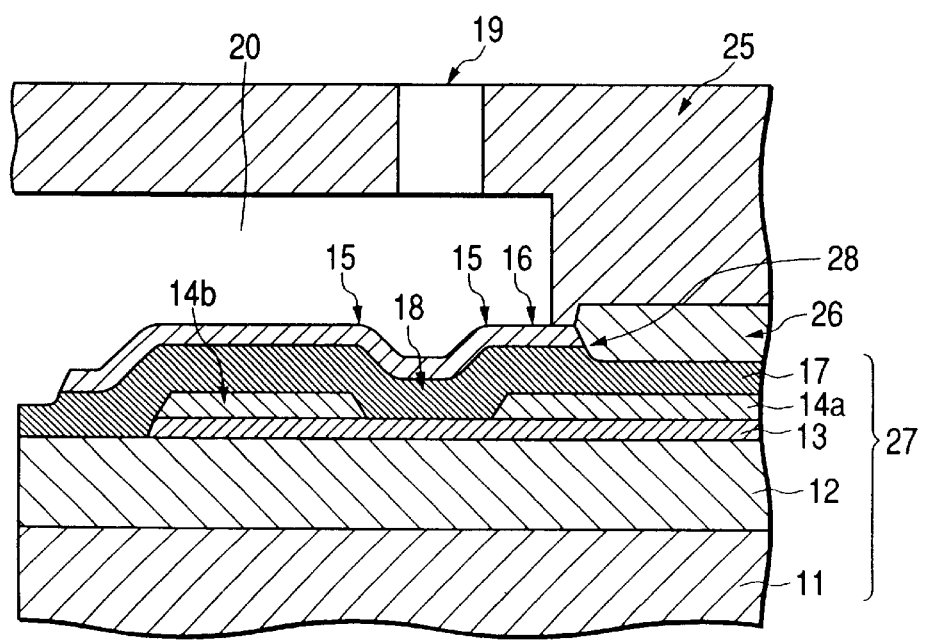
FIG. 22 is a sectional view showing the major portion of the liquid discharging head for the embodiment shown in FIG. 21.

FIG. 21 is a plan view showing the major portion of the liquid discharging head prepared in Example 2, and FIG. 22 is an 22—22 sectional view of the head shown in FIG. 21, where the devices marked with 25 and 26 are the member for forming the discharge port, and adhesive layer to improve adhesion between the substrate and member for forming the discharge port, respectively. The assembly of the substrate and member for forming the discharge port corresponds to the recording device substrate H110. The other structural features and effects are similar to those associated with the recording head H1001 of Example 1.

The liquid discharging head shown in FIGS. 21 and 22 was fabricated by assembling the adhesive layer 26 and member for forming the discharge port 25 with the substrate unit 27 for the liquid discharging head, similar to that described in Example 1.

The substrate unit 27 for the liquid discharging head, similar to that described in Example 1, was coated with polyether amide resin to a thickness of 2.0 µm as the adhesive layer 26 by the following procedure. The polyether amide resin (Hitachi Chemical Co., Ltd., HIMAL1200) was spread over the substrate unit 27 by a spinner, and baked at 100° C. for 30 min and 250° C. for 1 hour.

The resin layer was then patterned using a positive resist (Tokyo Ohka Kogyo Co., Ltd., OFPR800), and further patterned by an $O_2$ plasma asher with the OFPR patterns serving as the mask. The OFPR patterns as the mask were removed, to form the adhesive layer 26, shown in FIGS. 21 and 22.

The substrate unit was coated with a positive resist (Tokyo Ohka Kogyo Co., Ltd., ODUR), a dissolvable photosensitive material, and patterned to have 12 µm thick ink passage patterns (not shown).

A coating resin layer as the member 25 for forming the discharge port was formed on the substrate unit 27, and the discharge port 19 was formed by patterning. The coating resin layer is preferably photosensitive, because it helps form the discharge port 19 easily and precisely by photolithography. In this example, an epoxy resin hardened by cationic polymerization was used for its adhesion to the substrate unit 27 and resistance to ink.

Next, the SiN film on the ink discharge port 21 and ink passage patterns of ODUR were removed by chemical dry etching (CDE) for the former and immersion in a dissolving solution for the latter, and the epoxy resin for the member 25 for forming the discharge port was heated and completely hardened at 180° C. for 1 hour, to prepare the liquid discharging head.

The member 25 for forming the discharge port was joined with portion of the second protective layer 16 and portion of the first protective layer 17 not covered by the second protective layer 16, as shown in FIGS. 21 and 22, via the adhesive layer 26. The substrate unit 27, coated with the first protective layer 17 and second protective layer 16, is adhered faster to the member 25 for forming the discharge port via the adhesion layer 26.

The increased adhesion realized in this example prevents exfoliation of the member 25 for forming the discharge port, thereby improving reliability of the liquid discharging head, as discussed below.

As described in Example 1, when the portion of the first protective layer 17 not covered by the second protective layer 16 is made thinner than the portion of the first protective layer 17 covered by the second protective layer 16 in the production of the substrate unit, the side wall 28 is formed, in addition to the second protective layer 16, by the first protective layer 17 in the vicinity of the boundary between the portion of the first protective layer 17 covered by the second protective layer 16 and that of the first protective layer 17 not covered by the second protective layer 16. As a result, adhesion between the first protective layer 17 and adhesive layer 26 on the substrate unit 27 for the liquid discharging head is improved in the vicinity of the second protective layer 16, efficiently preventing exfoliation of the member 25 for forming the discharge port.

The side wall 28 can be tapered, when it is formed by dry etching for overetching. FIG. 13, used for describing Example 1, shows the first protective layer 17 and second protective layer 16 tapered at almost the same angle. FIG. 22 shows another embodiment in the first protective layer 17 is tapered more moderately than the second protective layer 16. The tapered shape may have a radius. The first protective layer 17 and second protective layer 16 should be tapered at a sharper angle, in order to improve the adhesion.

Another Example

Examples 1 and 2 describe the side shooter type recording head H1001, in which the discharge port 19 and electrothermal transducer 18 face each other. However, the present invention is also applicable to an edge shooter type ink jet head, in which the discharge port is opened in the direction almost perpendicular to the electrothermal transducer surface.

Figure 16:
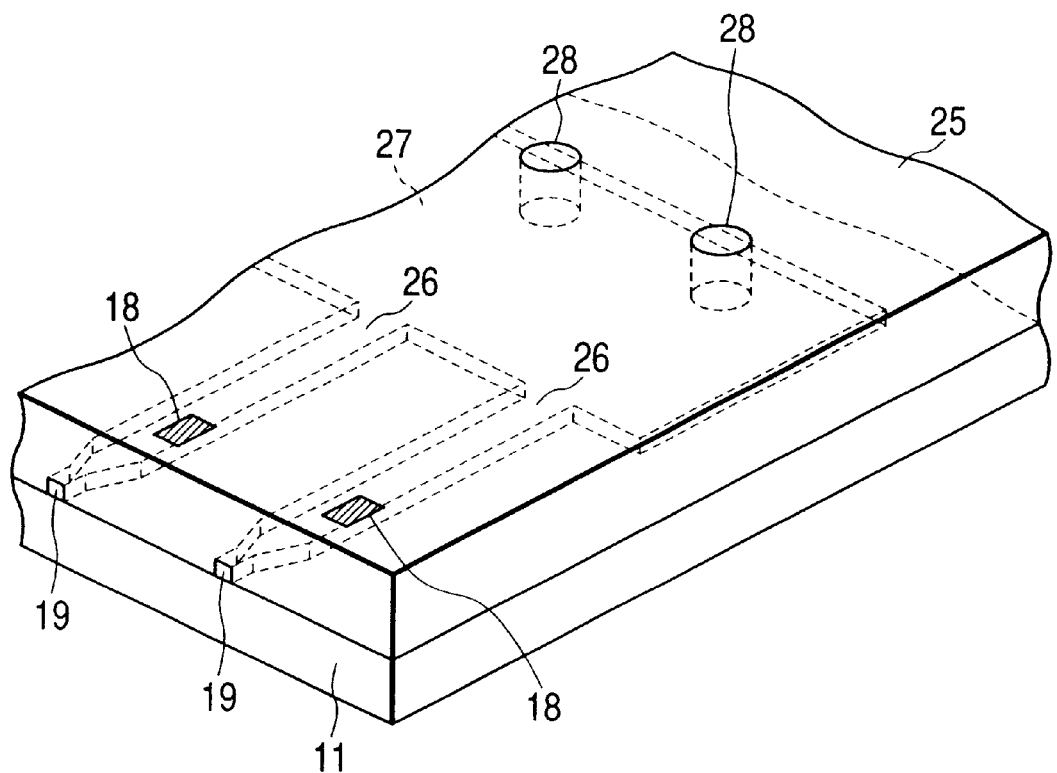
FIG. 16 is an oblique view showing appearances of another embodiment of the present invention for liquid discharging head.
Figure 17:
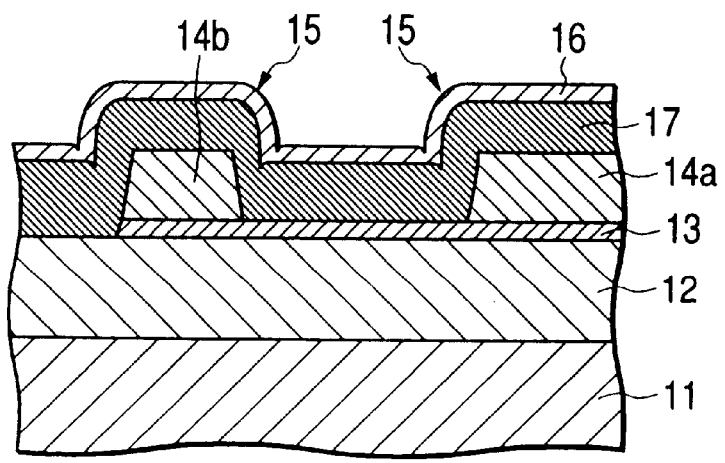
FIG. 17 is a section of substrate structure for one conventional ink jet head.
Figure 18:
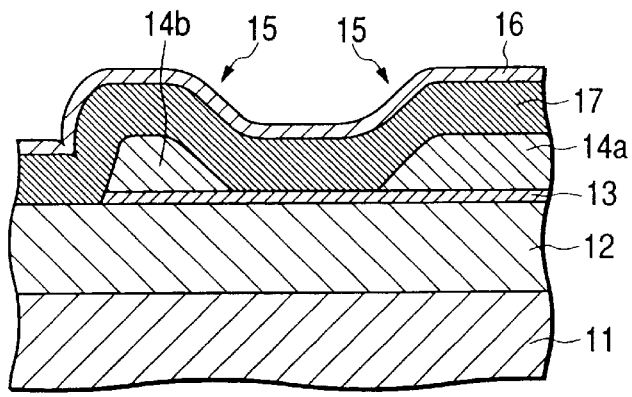
FIG. 18 is a section of substrate structure for another conventional ink jet head.
Figure 19:
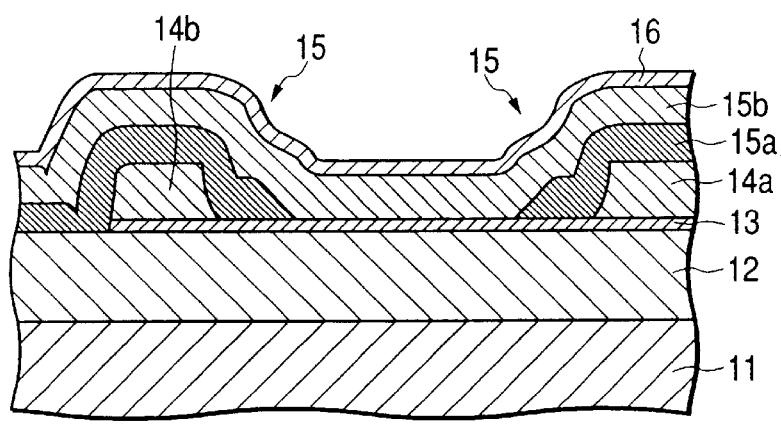
FIG. 19 is a section of substrate structure for still another conventional ink jet head.

FIG. 16 is an oblique view showing appearances of this embodiment of the present invention for liquid discharging head, where the members shown are marked with the same numbers, when they are functionally corresponding to those shown in other figures. The substrate 11 supports the grooved member 25 joined therewith, and between them there are discharge ports 19 arranged at given intervals, common ink chamber 27 from which the ink is supplied to each discharge port 19 via the ink passage 26, and ink supply ports 28 through which the ink is supplied to the ink chamber 27. The electrothermal transducer 18 gives thermal energy to the ink flowing in the ink passage 26 for film boiling, to discharge droplets of the ink from each discharge port 19. The other members have the same functions as those marked with the same numbers in the other figures.

The electrothermal transducer 18 formed on the substrate 11 in this example is structurally the same as those for the other examples.

What is claimed is:

1. A substrate unit for a liquid discharging head which gives thermal energy to a liquid for film boiling, to discharge droplets of the liquid from a discharge port of said head, comprising:

an electrothermal transducer provided on a substrate to generate the thermal energy;

a pair of electrode wiring circuits provided on the substrate and connected to said electrothermal transducer;

a first protective layer formed over essentially the entire substrate to cover said pair of electrode wiring circuits and transducer; and a second protective layer formed over the first protective layer to cover said transducer and an area in which said transducer is connected to said wiring circuits, wherein said pair of electrode wiring circuits are 1800 to 2400 Å thick, a portion of said first protective layer covered by said second protective layer is 2600 to 3400 Å thick, and a portion of said first protective layer not covered by said second protective layer is thinner than the portion of said first protective layer covered by said second protective layer.

2. The substrate unit for liquid discharging head according to claim 1, wherein a pair of said electrode wiring circuits are preferably 2000 to 2200 Å thick.

3. The substrate unit for liquid discharging head according to claim 1, wherein difference in thickness between the portion of said first protective layer covered by said second protective layer and that of said first protective layer not covered by said second protective layer is 200 Å or less.

4. The substrate unit for liquid discharging head according to claim 1, wherein difference in thickness between the portion of said first protective layer covered by said second protective layer and that of said first protective layer not covered by said second protective layer is 100 Å or more.

5. The substrate unit for liquid discharging head according to claim 1, wherein said first protective layer is at least 1.08 times thicker than a pair of said electrode wiring circuits.

6. A method for producing a substrate unit for a liquid discharging head which gives thermal energy to a liquid for film boiling, to discharge droplets of the liquid from a discharge port of the head, comprising:
   a step of forming an electrothermal transducer on a substrate to generate the thermal energy;
   a step of forming a pair of electrode wiring circuits on the substrate in such a way to connect them to the electrothermal transducer;
   a step of forming a 2600 to 3400 Å thick, first protective layer over essentially the entire substrate to cover the pair of electrode wiring circuits and the electrothermal transducer;
   a step of forming a layer to be a second protective layer; and
   a step of forming the second protective layer over the first protective layer to cover the electrothermal transducer and an area in which the electrothermal transducer is connected to the wiring circuits, by removing by dry etching a portion of the layer to be a second protective layer,
   wherein a portion of the first protective layer not covered by the second protective layer is thinner than a portion of the first protective layer covered by the second protective layer, and
   wherein the pair of electrode wiring circuits is 1800 to 2400 Å thick.

7. The method for producing a substrate unit for a liquid discharging head according to claim 6, wherein when the second protective layer is formed by dry etching, the portion of the first protective layer not covered by the second protective layer is 200 Å thick or less.

8. The method for producing a substrate unit for a liquid discharging head according to claim 6, wherein when the second protective layer is formed by dry etching, the portion of the first protective layer not covered by the second protective layer is 100 Å thick or more.

9. A liquid discharging head, comprising:
   discharge ports from which liquid is discharged;
   an electrothermal transducer on a substrate to generate thermal energy for causing film boiling of the liquid;
   a pair of electrode wiring circuits provided on the substrate and electrically connected to said electrothermal transducer;
   a first protective layer formed over essentially the entire substrate to cover said pair of electrode wiring circuits and electrothermal transducer; and
   a second protective layer formed over said first protective layer to cover said electrothermal transducer and an area in which said electrothermal transducer is connected to said wiring circuits, wherein:
   said pair of electrode wiring circuits are 1800 to 2400 Å thick,
   a portion of said first protective layer covered by said second protective layer is 2600 to 3400 Å thick, and
   a portion of said first protective layer not covered by said second protective layer is thinner than a portion of said first protective layer covered by said second protective layer.

10. The liquid discharging head according to claim 9, wherein said discharge ports are formed at intervals of 600 dpi in at least two rows running in parallel to each other, each of said discharge ports in one row being off the corresponding one in the other row by half a pitch.

11. The liquid discharging head according to claim 9, wherein said liquid is an ink and/or a treatment solution for adjusting printability of the ink on a printing medium.

12. The liquid discharging head according to claim 9, wherein said liquid is discharged by driving pulses given to said electrothermal transducer from said discharge port at 5 picoliter or less.

13. The liquid discharging head according to claim 9, wherein said head has an additional member for forming said discharge port, which is joined with portion of said second protective layer and portion of said first protective layer not covered by said second protective layer via an adhesive layer.

14. The liquid discharging head according to claim 13, wherein said first and second protective layers are tapered in the vicinity of the boundary between the portion of said first protective layer covered by said second protective layer and the one not covered by said second protective layer.

15. The liquid discharging head according to claim 14, wherein said first protective layer is tapered at a sharper angle than said second protective layer.

16. The liquid discharging head according to claim 13, wherein said adhesive layer is of polyether amide resin.

17. The liquid discharging head according to claim 13, wherein said member for forming the discharge port is of epoxy resin hardened by cationic polymerization.

18. The liquid discharging head according to claim 13, wherein said discharge port is installed at the side facing said electrothermal transducer.

19. A cartridge, comprising a liquid discharging head and a liquid tank storing liquid to be supplied to said liquid discharging head, said liquid discharging head comprising,
   a discharge port from which the liquid is discharged;
   an electrothermal transducer on a substrate to generate thermal energy for causing film boiling of the liquid;
   a pair of electrode wiring circuits provided on the substrate and connected to said electrothermal transducer;
   a first protective layer formed over essentially the entire substrate to cover said pair of electrode wiring circuits and electrothermal transducer; and
   a second protective layer formed over said first protective layer to cover said electrothermal transducer and an area in which said electrothermal transducer is connected to said wiring circuits, wherein
   said pair of electrode wiring circuits is 1800 to 2400 Å thick,
   a portion of said first protective layer covered by said second protective layer is 2600 to 3400 Å thick, and
   a portion of said first protective layer not covered by said second protective layer is thinner than a portion of said first protective layer covered by said second protective layer.

20. The cartridge according to claim 19, wherein said liquid tank is releasably attached to said liquid discharging head.

21. The cartridge according to claim 19, wherein said liquid discharging head has an additional member for forming the discharge port, which is joined with portion of said first protective layer not covered by said second protective layer and portion of said second protective layer via an adhesive layer.

22. An image forming apparatus, provided with a section for attaching a liquid discharging head, said liquid discharging head comprising:

discharge ports from which liquid is discharged;

an electrothermal transducer on a substrate to generate thermal energy for causing film boiling of the liquid;

a pair of electrode wiring circuits provided on the substrate and connected to said electrothermal transducer;

a first protective layer formed over essentially the entire substrate to cover said pair of electrode wiring circuits and electrothermal transducer; and a second protective layer formed over said first protective layer to cover said electrothermal transducer and an area in which said electrothermal transducer is connected to said wiring circuits, wherein said pair of electrode wiring circuits is 1800 to 2400 Å thick, a portion of said first protective layer covered by said second protective layer is 2600 to 3400 Å thick, and a portion of said first protective layer not covered by said second protective layer is thinner than a portion of said first protective layer covered by said second protective layer.

23. The image forming apparatus according to claim 22, wherein said section of attaching the liquid discharging head has a carriage which can be scanned in the direction intersecting the direction of travel of the printing medium onto which the liquid is discharged from the liquid discharging head.

24. The image forming apparatus according to claim 23, wherein said liquid discharging head is releasably attached to said carriage by attaching/detaching means.

25. The image forming apparatus according to claim 22, wherein said liquid discharging head has an additional member for forming the discharge port, which is joined with portion of said second protective layer and portion of said first protective layer not covered by said second protective layer via an adhesive layer.

* * * * *